United States Patent [19]
Fitch et al.

[11] Patent Number: 5,612,563
[45] Date of Patent: Mar. 18, 1997

[54] VERTICALLY STACKED VERTICAL TRANSISTORS USED TO FORM VERTICAL LOGIC GATE STRUCTURES

[75] Inventors: Jon T. Fitch; Carlos A. Mazuré; Keith E. Witek, all of Austin, Tex.

[73] Assignee: Motorola Inc., Schaumburg, Ill.

[21] Appl. No.: 186,872

[22] Filed: Jan. 25, 1994

Related U.S. Application Data

[62] Division of Ser. No. 3,813, Jan. 11, 1993, Pat. No. 5,308,778, which is a continuation of Ser. No. 844,044, Mar. 2, 1992, Pat. No. 5,286,674.

[51] Int. Cl.[6] ............................ H01L 29/76; H01L 29/94
[52] U.S. Cl. ............................ 257/329; 257/369
[58] Field of Search ...................... 257/329, 330, 257/331, 368, 369, 66

[56] References Cited

U.S. PATENT DOCUMENTS

| | | | |
|---|---|---|---|
| 4,272,880 | 6/1981 | Pashley | 29/571 |
| 4,489,478 | 12/1984 | Sakurai | 29/574 |
| 4,498,226 | 2/1985 | Inoue et al. | 29/576 |
| 4,554,570 | 11/1985 | Jastrzebski et al. | 357/23.4 |
| 4,596,604 | 6/1986 | Akiyama et al. | 148/1.5 |
| 4,651,408 | 3/1987 | MacElwee et al. | 29/576 |
| 4,740,826 | 4/1988 | Chatterjee | 257/369 |
| 4,810,906 | 3/1989 | Shah et al. | 307/448 |
| 4,902,637 | 6/1989 | Kondou et al. | 437/51 |
| 4,910,564 | 3/1990 | Inoue | 357/23.4 |
| 4,927,779 | 5/1990 | Dhong et al. | 428/52 |
| 4,974,060 | 11/1990 | Ogasawara | 357/23.6 |
| 4,992,838 | 2/1991 | Mori | 357/23.4 |
| 5,010,386 | 4/1991 | Groover, III | 357/42 |
| 5,017,504 | 5/1991 | Nishimura et al. | 437/40 |

OTHER PUBLICATIONS

"Impact of Surrounding Gate Transistor (SGT) for Ultra–High–Density LSI's", by Hiroshi Takato et al., was published in IEEE Trans. on Electron Devices, vol. 38, No. 3, Mar. 1991, pp. 573–577.

*Primary Examiner*—Steven H. Loke
*Attorney, Agent, or Firm*—Keith E. Witek

[57] ABSTRACT

A transistor (10) has a substrate (12) and a diffusion (14). A gate conductive layer (18) overlies the substrate (12) and has a sidewall formed by an opening that exposes the substrate (12). A sidewall dielectric layer (22) formed laterally adjacent the conductive layer (18) sidewall functions as a gate dielectric for the transistor (10). A conductive region is formed within the opening. The conductive region has a first current electrode region (28) and a second control electrode region (34) and a channel region (30) laterally adjacent the sidewall dielectric layer (22). A plurality of transistors, each in accordance with transistor (10), can be stacked in a vertical manner to form logic gates such as NMOS or PMOS NAND, NOR, and inverter gates, and/or CMOS NAND, NOR, and inverter gates with one or more inputs.

40 Claims, 19 Drawing Sheets

VERTICALLY STACKED VERTICAL TRANSISTORS USED TO FORM VERTICAL LOGIC GATE STRUCTURES

CROSS REFERENCE TO RELATED APPLICATIONS

This is a divisional of application Ser. No. 08/003,813 filed Jan. 11, 1993, now U.S. Pat. No. 5,308,778, which is a file wrapper continuation of application Ser. No. 07/844,044 filed Mar. 02, 1992, now U.S. Pat No. 5,286,674.

Related subject matter may be found in the following copending cases filed of even date herewith:

(1) U.S. Pat. No. 5,208,172 entitled "Method " by Fitch et al.

(2) U.S. Pat. No. 5,252,849 entitled "Transistor Useful for Further Vertical Integration and Method of Formation" by Fitch et al.

FIELD OF THE INVENTION

The present invention relates generally to semiconductor device and process technology, and more particularly, to vertical integration of transistors.

BACKGROUND OF THE INVENTION

Planar transistors are often used to fabricate integrated circuit logic devices. A planar transistor has a source electrode and drain electrode which are laterally separated by a channel region. Overlying the channel region is a gate electrode that is separated from the channel region by a gate oxide. Planar transistors, although used and useful in many integrated circuit logic applications, are area intensive and consume a large amount of substrate area per transistor. In addition, with integrated circuit geometries decreasing into sub-micron ranges, planar transistors have various disadvantages. At smaller geometries and thinner gate oxide thicknesses, well documented problems such as hot carrier injection, leakage currents, isolation, short channel behavior, and channel length variations are major problems in planar transistors.

To overcome some of the disadvantages described above for planar transistors, elevated source and drain transistors, lightly doped drain (LDD) transistors, and other improvements were developed. Although the improvements reduced some of the disadvantages listed above, the improvements had some undesirable characteristics. The primary undesirable characteristic is the fact that the improved transistors were, in most cases, as area intensive or more area intensive than the planar transistor.

Various approaches have been used to try to reduce circuit surface area and increase transistor packing density while at the same time reducing some of the adverse effects described above. The surrounding gate transistor (SGT) was developed wherein a spacer gate and planar diffusions are used to form a transistor. The SGT reduced some of the disadvantages that affect planar transistors and reduced surface area due to a vertically positioned spacer gate. Topography problems and the geometry of the SGT usually result in source and drain contacts that are difficult to achieve and are difficult to consistently produce using sub-micron technology. In addition, doping of source regions, drain regions, and channel regions via implants can be difficult due to geometry and may require special processing.

In order to further increase logic circuit density, the thin film transistor (TFT) has been developed, especially for memory applications. Although small memory cell areas can result via the use of TFTs, TFTs are highly resistive and therefore not adequate for all applications.

SUMMARY OF THE INVENTION

The previously mentioned disadvantages are overcome and other advantages achieved with the present invention. The present invention comprises a transistor and method of formation and logic structures formed therefrom. In one form, the transistor has a base layer wherein the base layer has a surface. A first dielectric layer is formed overlying the base layer. A control electrode conductive layer is formed overlying the first dielectric layer. A second dielectric layer is formed overlying the control electrode conductive layer. Portions of each of the first dielectric layer, the control electrode conductive layer, and the second dielectric layer are removed to form an opening which exposes the surface of the base layer. N conductive gates are formed from the control electrode conductive layer via the removal wherein N is an integer and each of the N conductive gates has a sidewall. Sidewall dielectrics are formed laterally adjacent each sidewall of the N conductive gates. A conductive region is formed within the opening. The conductive region has a first portion which functions as a first current electrode. The first portion is laterally adjacent the first dielectric layer and overlies the base layer. The conductive region has a second portion functioning as a channel region. The second portion is laterally adjacent the sidewall dielectric, and overlies the first current electrode. The conductive region has a third portion functioning as a second current electrode. The third portion is laterally adjacent the second dielectric layer and adjacent the channel region.

In one form, the transistor can be used to form stacked logic structures such as NOR, NAND, and inverter logic gates.

The present invention will be more clearly understood from the detailed description below in conjunction with the accompanying drawings.

DESCRIPTION OF THE PREFERRED EMBODIMENT

Figure 1:
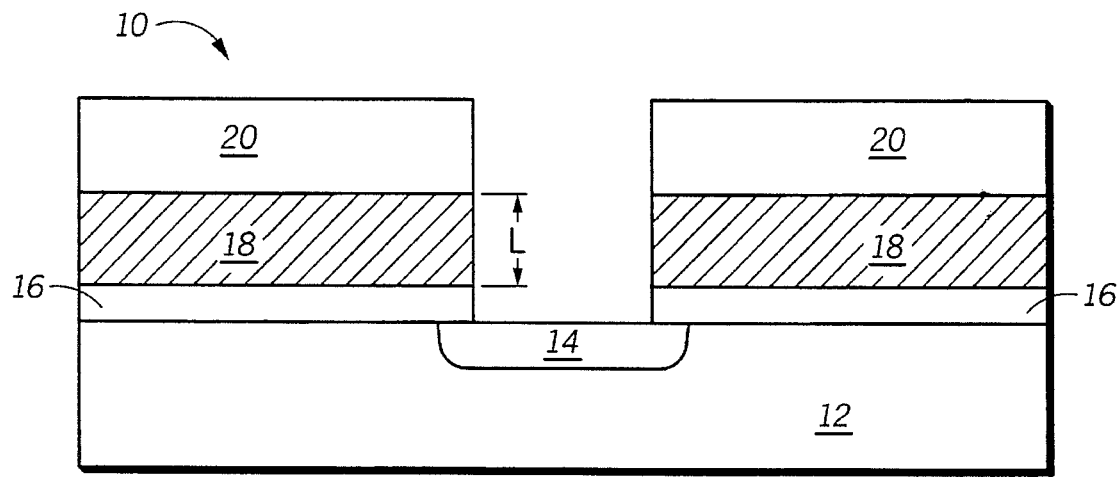
FIGS. 1–4 illustrate, in cross-sectional form, a transistor and method of formation in accordance with the present invention.

Illustrated in FIG. 1 is a structure suitable for formation of a transistor 10. The transistor 10 has a base layer which is a substrate 12 having a surface and having a first conductivity type. If transistor 10 represents a first transistor formed overlying a second transistor (not illustrated), the base layer for the first transistor is a conductive top layer or top electrode of the underlying second transistor. Substrate 12 may be made of silicon, gallium arsenide, silicon on sapphire, epitaxial formations, germanium, germanium silicon, polysilicon, and/or like substrate materials. Preferably, the substrate 12 is made of silicon. A diffusion 14 is formed within the substrate 12. Various methods may be used to form diffusion 14. These methods are discussed below. A first dielectric layer 16 is formed overlying the substrate 12 and initially overlying the diffusion 14. A control electrode conductive layer 18 is formed overlying the dielectric layer 16. In a preferred form, conductive layer 18 is polysilicon, but conductive layer 18 may be a metal, a salicide or silicide, germanium silicon, or the like. A second dielectric layer 20 is formed overlying the conductive layer 18.

The dielectric layers 16 and. 20, and all other dielectrics described herein may vary in physical and chemical composition based upon the function they perform. The dielectric layers described herein may be wet or dry silicon dioxide ($SiO_2$), nitride, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride (P—$SiN_x$) and/or the like. Specific dielectrics are noted where a specific dielectric is preferred or required.

A masking layer of photoresist (not illustrated) is deposited overlying the dielectric layer 20. The masking layer is conventionally patterned and etched to form a mask opening that exposes a portion of the dielectric layer 20. A portion of the dielectric layer 20 is etched selective to the conductive layer 18 to form an opening in the dielectric layer 20. A portion of the conductive layer 18 is etched selective to the dielectric layer 16 to deepen the opening by etching into the conductive layer 18. A portion of the dielectric layer 16 is etched selective to the substrate 12 to further deepen the opening by etching into the dielectric layer 16. The etching of the dielectric layer 16 exposes diffusion 14. The etching of the dielectric layers 16 and 20 and control electrode conductive layer 18 results in an opening that is self-aligned to the mask opening. The opening is referred to as a "device opening" in some cases. Inherently, the formation of the dielectric layer 20 of FIG. 1, along with the dielectric layer 16, will result in the electrode 18 being completely surrounded by dielectric material.

The diffusion 14, in FIG. 1, is formed in one of at least two ways. In one form, diffusion 14 can be implanted or diffused into the substrate selectively through the use of one of a photoresist mask, an oxide mask, a nitride mask or the like. Diffusion 14, in a similar manner, can be implanted through an oxide or like material to ensure a shallow, dopant-dispersed junction. This implantation or diffusion occurs before the formation of the conductive layer 18. In a second method, the diffusion 14 can be implanted or diffused after the formation of the device opening. The second method, when using implantation, is preferred due to the fact that the resulting diffusion 14 is self-aligned to the device opening or opening. The opening can be of any geometry or size but is preferably a circular contact of minimum lithographic size.

Figure 2:
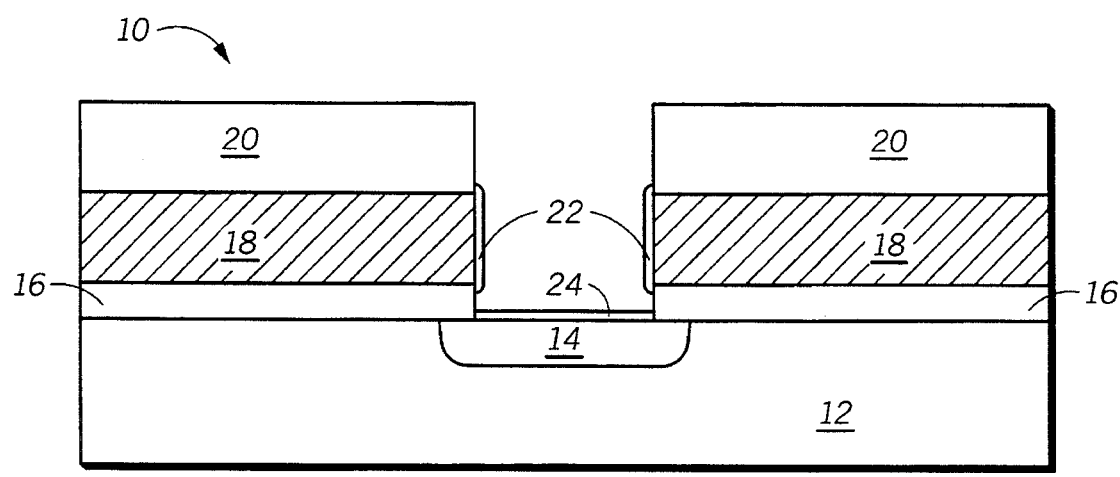

FIG. 2 illustrates a sidewall dielectric layer 22 formation step. A sidewall dielectric layer 22 is formed on a sidewall of the conductive layer 18 that results from the formation of the opening. Due to the fact that the dielectric functions as a gate oxide, the dielectric layer 22 is in most cases a grown $SiO_2$ layer. The growth of dielectric layer 22 will result in a thin dielectric layer 24 being grown on the exposed surface of the diffusion 14.

Figure 3:
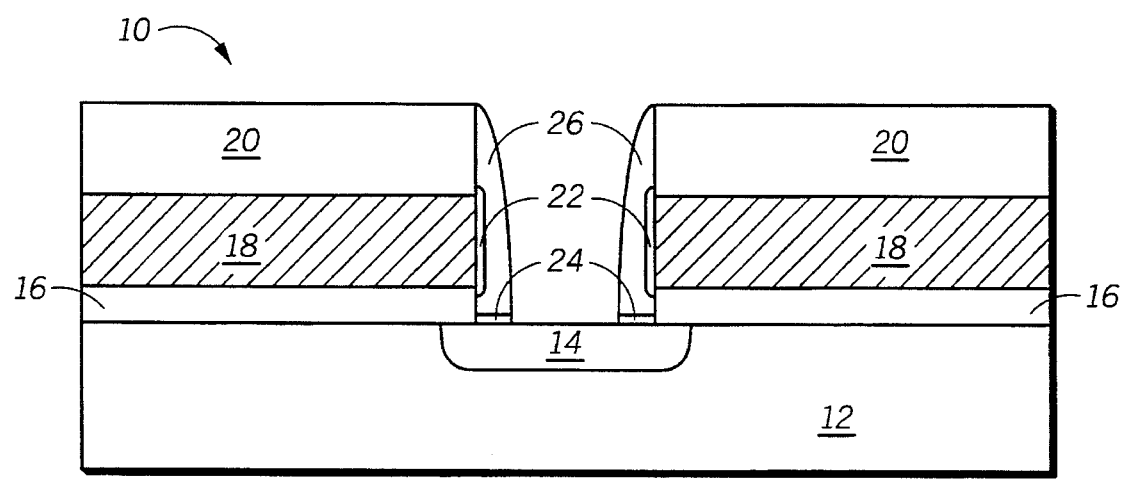

The formation of the dielectric layer 24 is a side-effect that is undesirable. Therefore, FIG. 3 illustrates a dielectric removal step for a portion of the dielectric layer 24. A spacer 26 or like formation is formed overlying the dielectric layer 24 and adjacent the dielectric layer 22. Preferably, the spacer 26 is nitride, cylindrical in geometry, and formed within and adjacent a sidewall of the device opening. The spacer 26 forms an inner opening within the device opening. The spacer 26 is used to protect the dielectric layer 22 from subsequent oxide etching. An oxide etch is then performed selective to spacer 26 and substrate 12. The oxide etch removes a portion of dielectric layer 24 that lies within the cylindrical dielectric spacer 26. A portion of the dielectric layer 24 which underlies the spacer and surrounds a periphery of the opening remains unetched. The spacer 26 is then removed via conventional nitride or removable spacer techniques.

Figure 4:
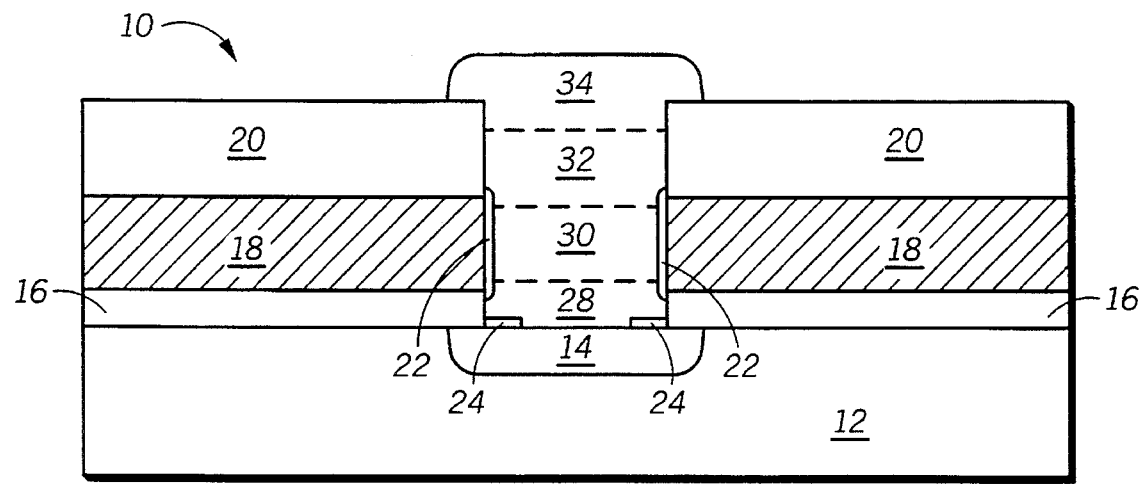

In FIG. 4, first and second current electrodes, also respectively referred to as a drain and a source, and a channel region are formed. In a preferred form, a grown conductive region is used to form the first and second current electrodes and the channel region. Preferably, the grown conductive region is formed via epitaxial growth of a base layer of material.

The transistor 10 is placed into a piece of equipment suitable for epitaxial growth. Growth is initiated by heating transistor 10 and subjecting exposed portions of the diffusion 14 or the substrate 12 to a chemical compound such as dichloro-silane or a similar silicon source gas.

Initially, a first current electrode or drain electrode 28 is formed in the device opening. Electrode 28 is formed of a second conductivity type that is opposite the first conductivity type. In order to dope the drain electrode 28 with dopant atoms of a second conductivity type, in-situ doping is preferred although ion implantation is possible. In-situ doping means that the drain electrode 28 is doped during growth by a dopant gas source. If the second conductivity type is P type, then a boron-containing gas or a like dopant gas is used to dope drain electrode 28. If the second conductivity type is N type, then a phosphorus-containing, arsenic-containing, or like dopant gas is used to dope electrode 28. Drain electrode 28 is grown adjacent the first dielectric layer 16, with in-situ doping, until the drain electrode 28 is adjacent or nearly adjacent a bottom portion of the sidewall dielectric 22 as illustrated in FIG. 4.

Epitaxial growth continues in a similar manner to form a channel region 30. The channel region 30 is formed of the first conductivity type, preferably via in-situ doping as described herein. Due to the fact that dielectric layer 22 is a gate oxide and that conductive layer 18 functions as a gate, the doping in the channel region 30 can be used to adjust threshold voltages. The channel region is grown, with in-situ doping, until the electrode is adjacent or nearly adjacent a top portion of the sidewall dielectric 22 as illustrated in FIG. 4.

Epitaxial growth continues in a similar manner to form a second current electrode, also referred to as a source electrode, of a second conductivity type. The second current electrode has two sub-regions. The two sub-regions are a lightly doped electrode 32 and a heavily doped electrode 34. The electrodes 32 and 34 are formed by changing the in-situ doping concentration during growth. Initially, the second conductivity doping gas is at a predetermined concentration. After a predetermined time, and therefore after a predetermined epitaxial growth thickness, the lightly doped electrode 32 is formed and the dopant concentration is increased to a second predetermined level. While maintaining the second predetermined level, epitaxial growth continues to form the heavily doped electrode 34.

It is advantageous to have a transistor with a half lightly doped drain (LDD) structure as illustrated in FIG. 4. In general, LDD regions result in an increase in series resistance. If the LDD region can be formed only at a source electrode, where the LDD region is most needed, the advantages of the LDD configuration are preserved while reducing series resistance. It should be noted that a source and a drain region can be interchangeable in the structure of FIG. 4. If the source and drain functionality is switched (i.e. the source is formed underlying the channel region 30 and the drain is formed overlying the channel region 30), an LDD structure may be formed for the lower electrode 28. It should also be apparent that a full LDD transistor can be formed by forming LDD regions for both the source and the drain. It is important to note that LDD regions are optional and that the doping for both the source and the drain regions can be a constant.

It is also important to note that epitaxial growth requires a clean surface, therefore before initiating growth a cleaning cycle, such as a conventional RCA oxidizing clean, an Ishizaka-Shiraki clean, or an equivalent cleaning cycle, is performed. In addition, a thin film transistor (TFT) can be formed by the epitaxial approach described above. If the substrate 12 is polysilicon instead of single crystalline silicon, then polysilicon electrode regions and channel regions are epitaxially grown. This growth forms a vertical TFT that will be similar in structure to the transistor 10 of FIG. 4. A vertical TFT can be helpful in terms of saving area in memory cell designs.

Figure 5:
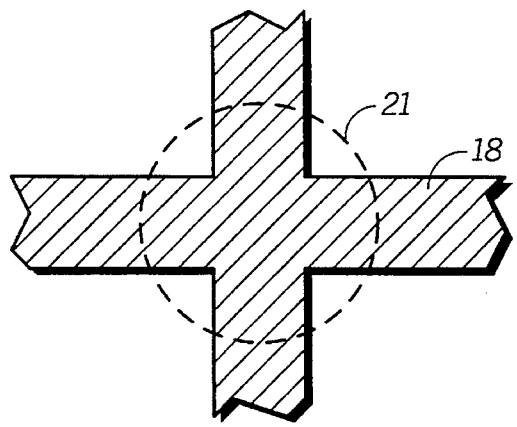
FIG. 5 illustrates, in a top perspective form, a method wherein the method of FIG. 1 is used to form a transistor having a plurality of gates.

It is important to note that the formation of the opening in FIG. 1 can be used to form a multi-gated transistor having a plurality of gate electrodes. The plurality of gate electrodes or N gates, where N is an integer, is formed in one of two ways. A first method involves forming a gate conductive layer, lithographically masking the gate conductive layer, and etching to form N physically separate and distinct gates. In this method, photolithographic alignment to the device opening is critical and therefore this method is not preferred. A preferred method would be to form a gate conductive layer as a single region or layer and use the formation of the device opening to separate the single gate conductive layer into N conductive gate regions. This method assures that all of the gates are self-aligned to the device opening. FIG. 5 illustrates, in one form, a top perspective view of the gate conductive layer 18 and a device opening 21 that is used to etch the layer 18 into N self-aligned gates, where N is four in the illustrated example.

Figure 6:
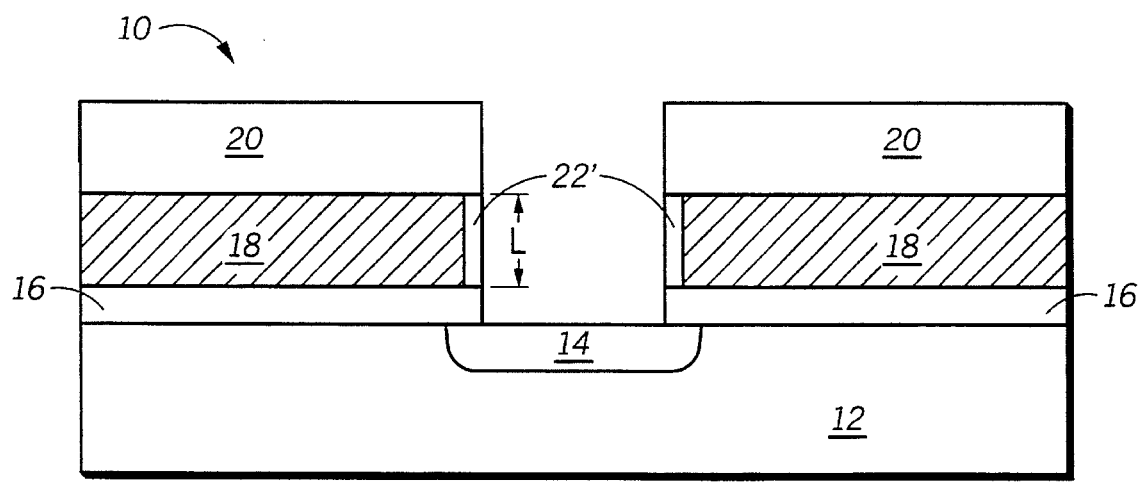
FIG. 6 illustrates, in cross-sectional form, an alternative method of sidewall dielectric formation for a transistor in accordance with the present invention.

In FIG. 4, the dielectric layer 24 that remains around a periphery of the device opening reduces epitaxial seeding area for subsequent epitaxial growth. Therefore, FIG. 6 illustrates an alternative method that may be used to replace the steps of FIGS. 2–3 and achieve a greater epitaxial seeding area. When etching the dielectric layers 16 and 20 and the conductive layer 18 to form the opening, a dielectric layer 20 etch followed by a conductive layer 18 etch, followed by a dielectric layer 16 etch is usually used to expose the substrate 12 and self-align various features of transistor 10. If during the conductive layer 18 etch an over-etch or isotropic etch is performed, the conductive layer 18 will laterally etch and recess into a "cave" having sides defined by the dielectric layers 16 and 20. With a conductive layer 18 that is recessed from a sidewall of the opening, a dielectric layer 22' can be formed as illustrated in FIG. 6. The formation of the dielectric layer 22' forms a surface dielectric layer (not illustrated) overlying the diffusion 14 which may be removed. The difference is that a spacer is no longer needed. A reactive ion etch (RIE) can be performed to completely remove the surface dielectric layer from the surface of the diffusion 14 without affecting the recessed dielectric layer 22'.

During RIE etching, plasma damage can result in the dielectric layer 22'. Due to the fact that the dielectric layer 22' functions as a gate oxide, dielectric layer 22' must be of excellent quality. Therefore, to avoid or reduce plasma damage during RIE etching, the dielectric layer 22' is usually nitrided via $N_2$, $N_2O$, $NH_3$, or an equivalent. A nitrided oxide material resists plasma damage more than other oxide materials. A nitrided oxide is advantageous but optional for transistor 10.

Both N-channel and P-channel transistors can be formed. If the first conductivity is N type and the second conductivity is P type, then a P-channel vertical transistor is formed. If the first conductivity is P type and the second conductivity is N type then an N-channel vertical transistor is formed.

In most cases, the transistor 10 of FIG. 1 will have a conductive layer 18 that completely surrounds the channel region 30. A completely surrounding conductive layer 18 allows for maximum current carrying capability, a more consistent aspect ratio (transistor width/transistor length ratio), and reliable photolithographic alignment. In other cases, an increased packing density can be achieved by partially surrounding the channel region 30 with conductive layer 18. This increased packing density is achieved by avoiding spacing requirements between conductors for most polysilicon and metal design rules.

The transistor 10 may be used to form vertically stacked logic gates or circuits. Some of the gates that may be formed are N type metal oxide semiconductor (NMOS) NOR, NAND, and inverter gates and P type metal oxide semiconductor (PMOS) NOR, NAND, and inverter gates. Complementary metal oxide semiconductor (CMOS) NOR, NAND, and inverter gates can also be manufactured with transistor 10. In addition, NMOS or PMOS gates can be manufactured with resistive loads, enhancement load transistors, or depletion load transistors. All of the transistors that are used to manufacture the above listed logic gates may have all of the flexibility described above for transistor 10 with respect to sidewall dielectric formation, LDD regions, doping profiles, diffusions, and the like.

Transistor 10 can be vertically stacked on top of another transistor 10 to implement logic gates and circuits with a surface area of approximately a contact opening. The contact opening or device opening is usually sub-micron in size. For example, a plurality of M transistors, wherein M is an integer, is stacked overlying each other. Each of the stacked transistors is independently either N-channel or P-channel devices. P-channel means that a transistor has P type doped source and drain regions. N-channel means that a transistor has N type doped source and drain regions. Each of the stacked transistors has from one to N conductive gates and N may differ in value between each of the M stacked transistors.

In a stack of M transistors, the second current electrode, or top electrode, of a bottom transistor is connected to a first current electrode, or bottom electrode, of an overlying transistor. Due to this connection scheme, a P type region will be in contact with an N type region in some cases and create a PN junction. To avoid diode voltage drops across PN junctions, a salicide, metal, silicide, or like material is used to electrically short circuit the PN junction.

The method of stacking transistors described above is well suited to form logic gates and circuits within a small substrate surface area. For example, FIGS. 7–14 illustrate a method and a structure suitable for formation of either an NMOS or a PMOS two-input NOR logic gate 11. Whether the device is an NMOS or a PMOS device is dependent upon doping methods. Two stacked transistors are needed to form the NOR logic gate 11.

Figure 7:
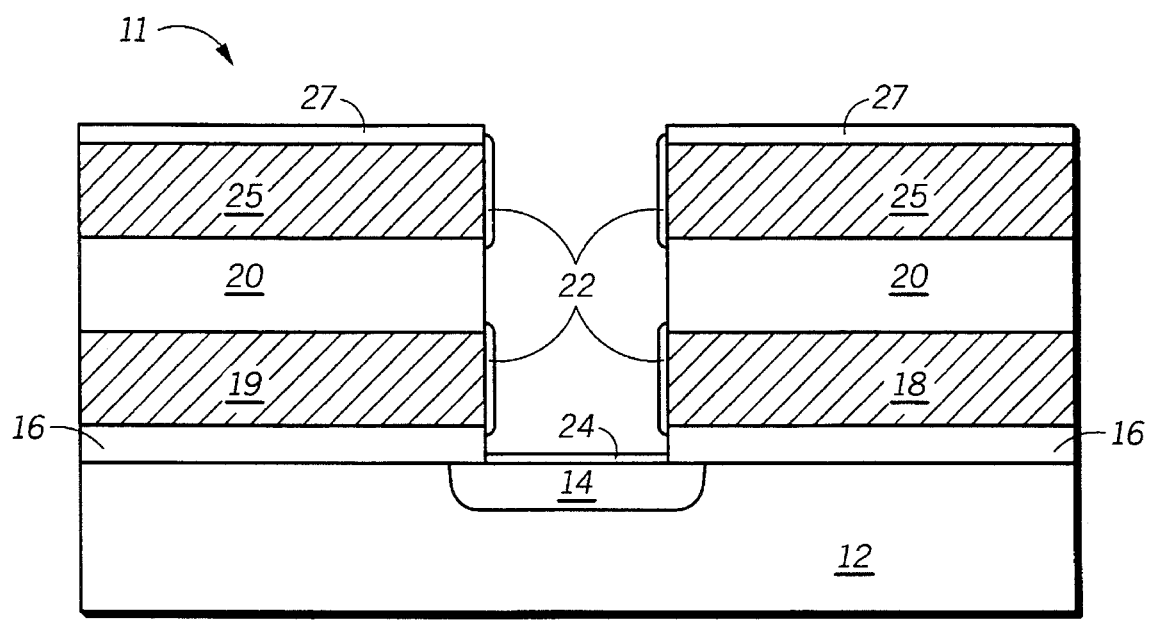
FIGS. 7–14 illustrate, in cross-sectional form, an MOS two-input NOR gate and method of formation using a transistor in accordance with the present invention.

In FIGS. 7–14, elements that are analogous to elements of FIGS. 1–5 are identically labeled for brevity and therefore not explained in detail below. The elements of FIGS. 7–14 that are analogous to elements in FIGS. 1–5 should be allowed all of the alternatives and modifications described herein for FIGS. 1–5. FIG. 7 is substantially equivalent to FIGS. 1–2 and illustrates formation of dielectric layers 16, 20, and 27, formation of conductive layers 18, 19, and 25, formation of the device opening that exposes the substrate 12, formation of sidewall dielectric 22 and dielectric layer 24, and formation of the diffusion 14.

It is important to discuss the layers and regions of FIG. 7 that differ from FIGS. 1–5. Conductive layers 18 and 19 are formed from a single conductive layer in a manner similar to that illustrated in FIG. 5. Conductive layer 25 has been formed overlying the dielectric layer 20 and functions as a logic output conductor. In addition, a dielectric layer 27 is formed overlying the conductive layer 25. The conductive layers 18 and 19 respectively form a first conductive gate electrode and a second conductive gate electrode. Therefore, a transistor formed within the device opening and adjacent the conductive layers 18 and 19 will be double-gated.

Figure 8:
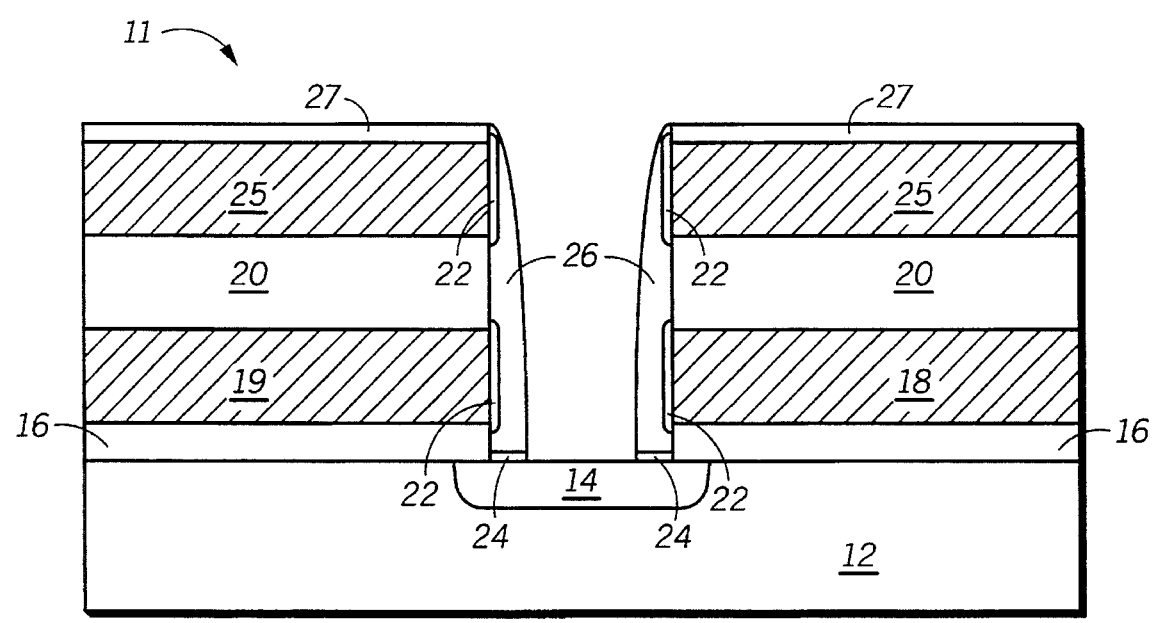

In FIG. 8, the sidewall dielectric method that utilizes a spacer 26 for protection, which was described above, is illustrated. It is important to note that the recessed sidewall approach presented herein in FIG. 6 is a viable alternative to the spacer method in FIG. 8 and vice versa. A portion of dielectric layer 25 is removed in FIG. 8.

Figure 9:
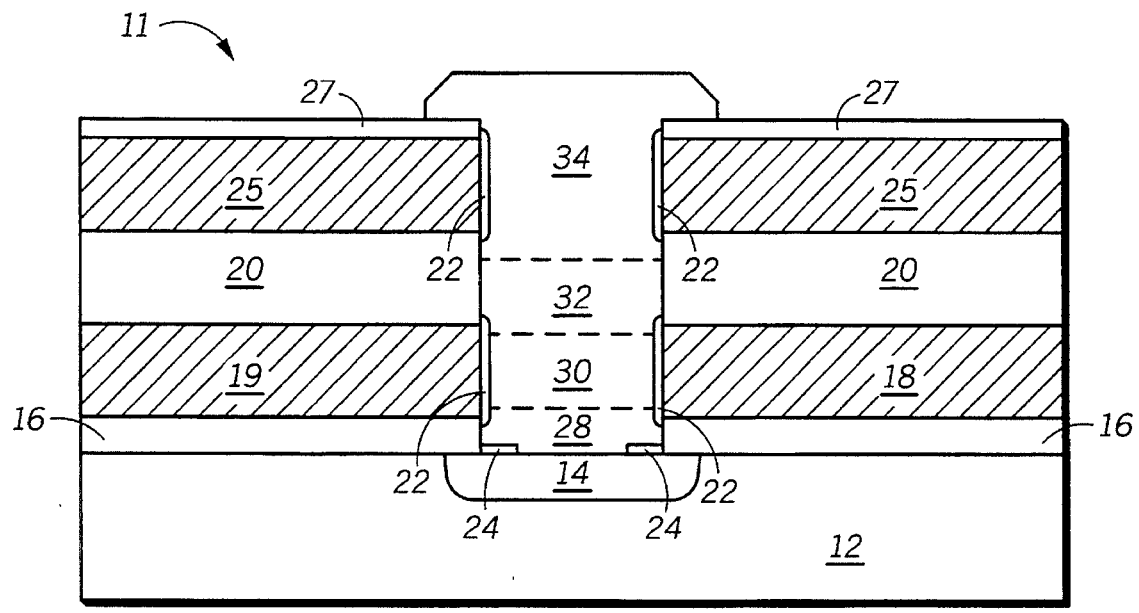

In FIG. 9, a conductive region is formed within the device opening having electrode regions and a channel region nearly identical to FIG. 4. In FIG. 9 a half LDD structure is illustrated. The method of forming electrodes and channel regions via epitaxial growth is described in detail in connection with FIG. 4. As stated previously, the conductive region that forms the electrodes and channel region may be optionally formed in a full LDD structure, a half LDD structure, or in a structure with no LDD regions. The conductive region and the conductive layers 18 and 19 form a first transistor.

Figure 10:
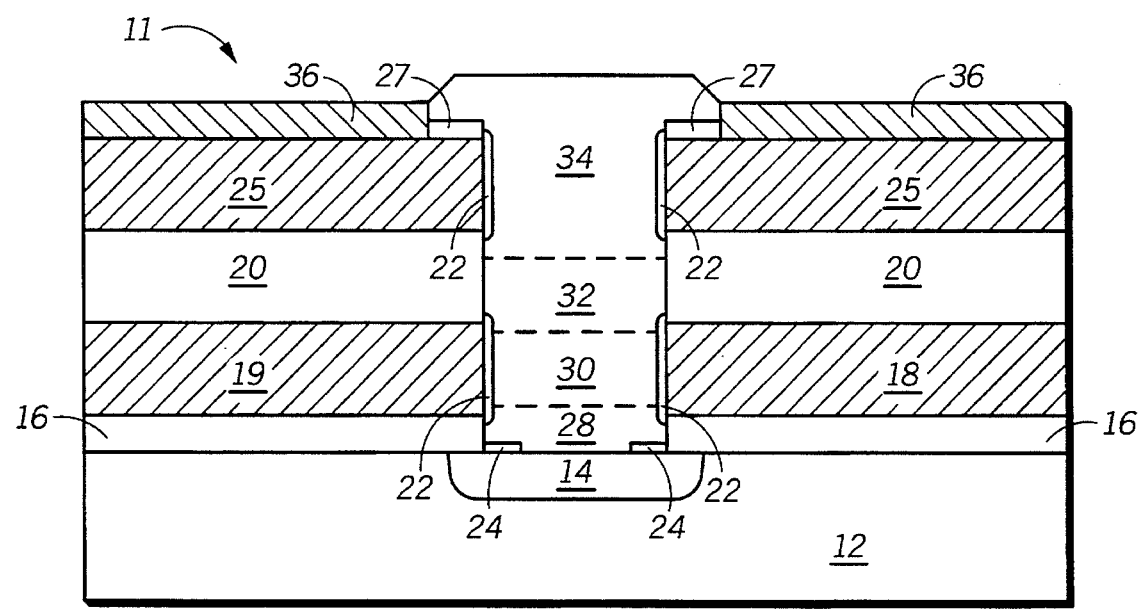

In FIG. 10, portions of the dielectric layer 27 are removed to expose portions of the conductive layer 25. A brief epitaxial growth step or a deposition and etch procedure is used to form an electrical contact between conductive layer 25 and heavily doped electrode 34. Preferably, a brief epitaxial growth step links conductive layer 25 to the heavily doped region 34 via the epitaxial link layer 36. Sidewall contacts, other forms of epitaxial growth, deposition and etch procedures, and the like can be used to form a link layer similar to layer 36.

Figure 11:
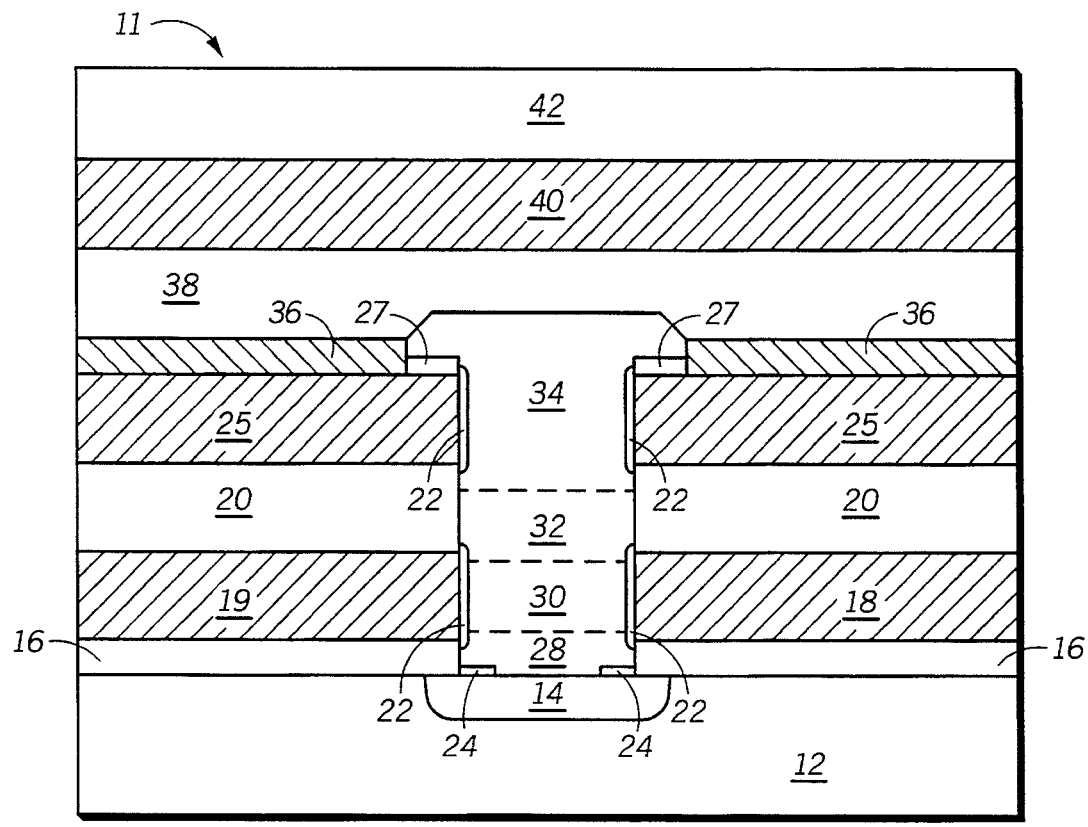

In FIG. 11, dielectric layers 38 and 42 and a conductive layer 40 are formed to allow for a formation of a second transistor. The second transistor overlies the first transistor which is gated by conductive layers 18 and 19. The second transistor uses heavily doped electrode 34 as a base layer. The base layer provides epitaxial quality material for the formation of the overlying second transistor. The dielectric layers 38 and 42 and the conductive layer 40 are formed in a manner similar to that described in FIG. 1.

Figure 12:
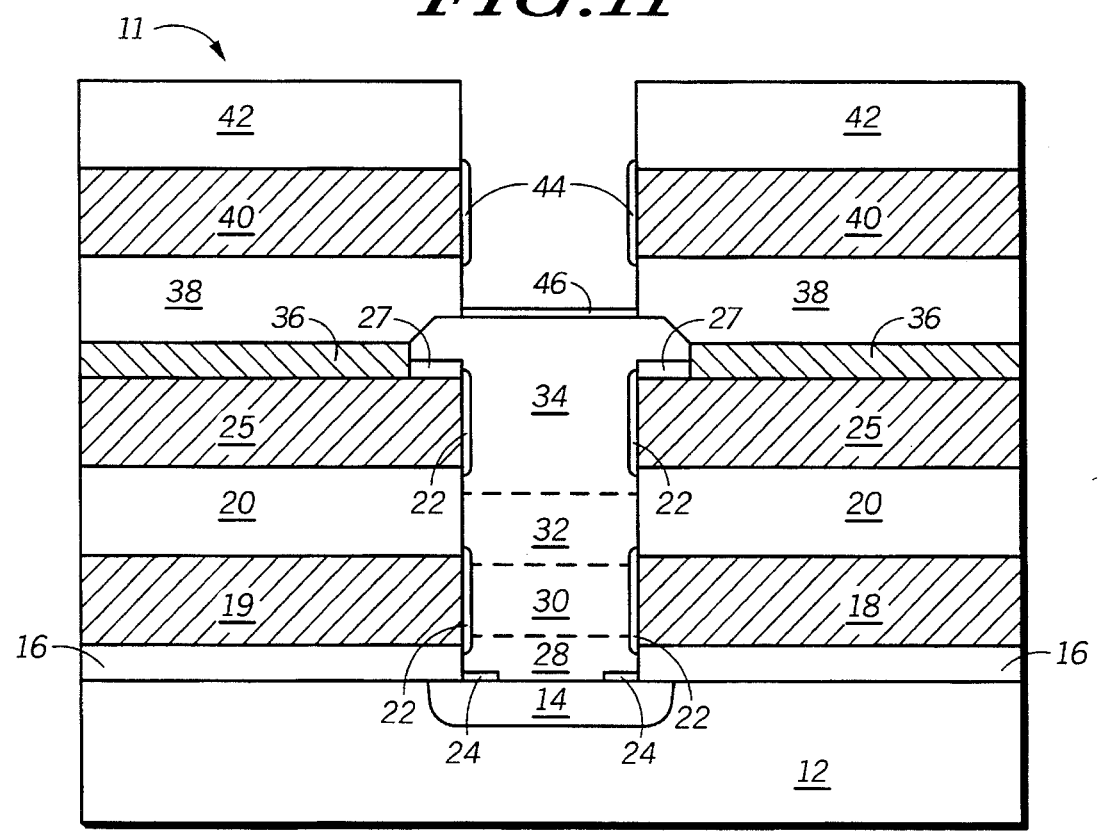

In FIG. 12, a second device opening, or second opening, is formed through the dielectric layers 38 and 42 and the conductive layer 40. A sidewall dielectric 44 is formed in a manner similar to that described in connection with FIGS. 1–2. The second transistor is single-gated by the conductor 40. Conductor 40 either completely surrounds a perimeter of the second opening or partially surrounds the perimeter of the second opening. A dielectric layer 46, analogous to dielectric layer 24 of FIG. 7, is formed overlying the heavily doped electrode 34 during sidewall dielectric layer formation.

Figure 13:
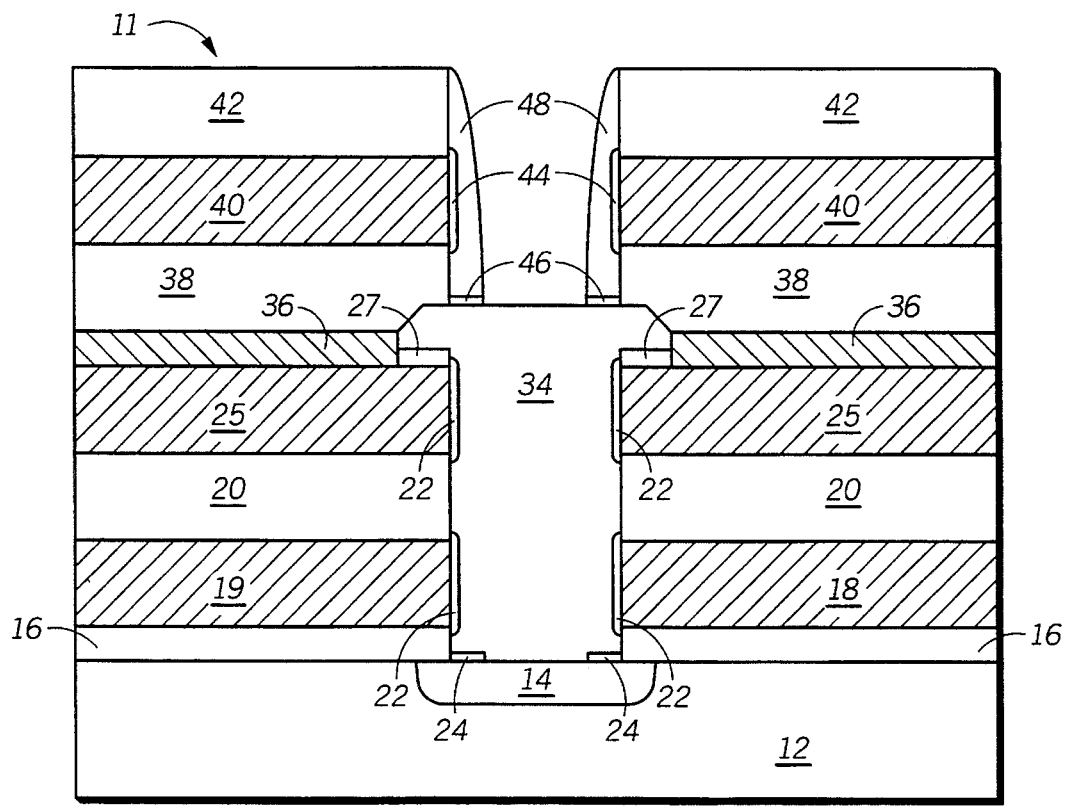
Figure 14:
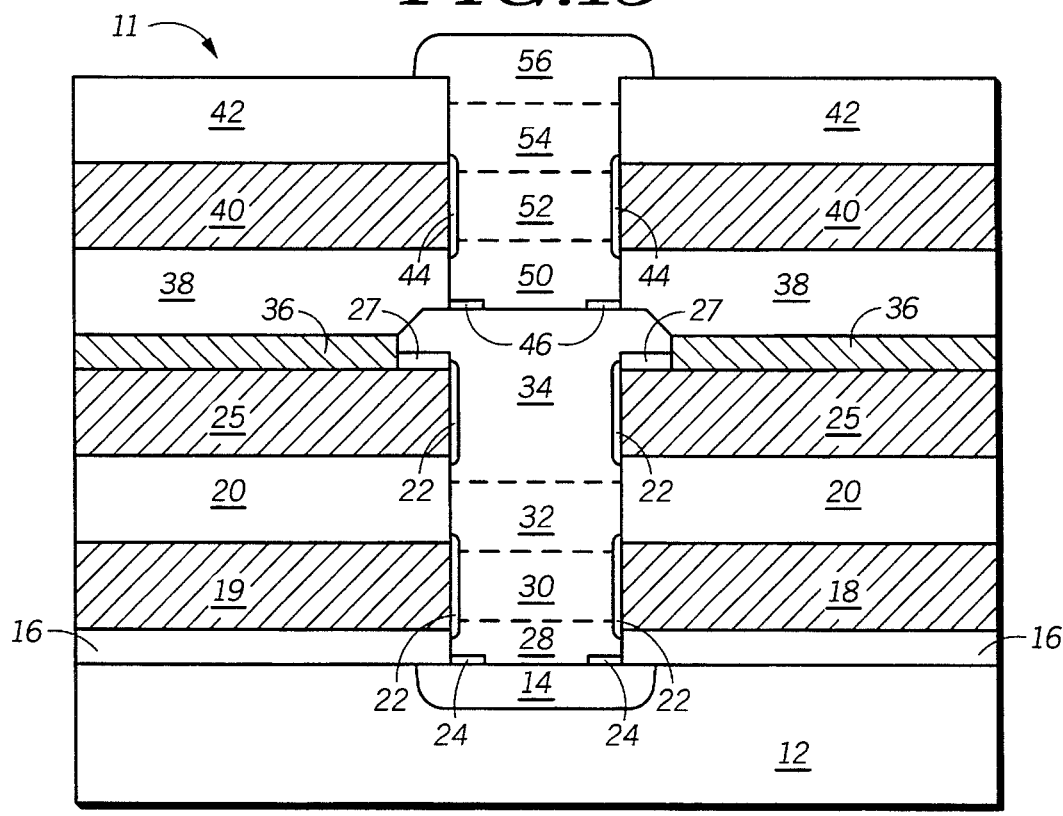

FIG. 13 illustrates a sidewall spacer and dielectric removal step analogous to that of FIG. 8. The dielectric layer 46 that is not underlying the spacer is removed. In FIG. 14, a second conductive region is formed having a first current electrode 50, a channel region 52 and a second current electrode which has sub-regions referred to as a lightly doped drain region 54 and a highly doped drain region 56.

The structure in FIG. 14, if connected properly, forms a NOR logic gate 11. To form a NOR gate, diffusion 14 is connected to a ground potential or to a reference voltage terminal. A ground potential for most circuits is a zero volt signal. In some cases, NMOS devices, PMOS devices, and various circuit applications require ground potentials which are values other than zero volts, such as +5.0 V or −5.0 V. The heavily doped electrode 56 is connected to a power supply potential or terminal. Conductive layer 25 functions as an output of the NOR logic gate 11. It is important to note that electrical connection to the first current electrode 50 will also function as an output of the NOR logic gate 11. Conductive layer 19 is connected to a first input conductor. Therefore, conductive layer 19 is wired to carry a logic input signal A. Conductive layer 18 is connected to a first input conductor. Therefore, conductive layer 18 is wired to carry a logic input signal B.

Conductive layer 40 is electrically connected or routed to the heavily doped region 56 if the second transistor is doped to function as an enhancement mode device. Conductive layer 40 is electrically connected or routed to the conductive layer 25 if the second transistor is doped to function as a depletion mode device. The interconnection of conductive layers to each other, the electrical connection of diffusions to conductive layers, and the electrical connection of the conductive regions to metal and like conductors is not specifically illustrated due to the fact that these techniques are known in the art. In addition, techniques such as plug/planarization contacts and epitaxial growth contacts are feasible for forming the interconnections described herein.

If the current electrodes of FIG. 14 are implanted or in-situ doped P type and the channel regions are made N type, the resulting NOR logic gate is a PMOS NOR logic gate. If the current electrodes of FIG. 14 are implanted or in-situ doped N type and the channel regions are made P type, the resulting NOR logic gate is a NMOS NOR logic gate. In the discussion herein, logic gates may be referred to as gates and should not be confused with a transistor gate electrode.

The above description and illustrations also enables one to form other NMOS and PMOS gates such as inverters, NAND gates, and the like. In addition, the formation of N input gates, such as four-input or five-input NOR gates, and three-input NAND gates, should be apparent given the figures and specification disclosed herein. To create inverters, NAND gates, and the like, the circuit interconnections will change, the number of stacked transistors will vary, and the number of gates per transistor will change, but the processing should be analogous to the information illustrated in FIGS. 1–14. Therefore, subsequent NMOS and PMOS device structures are discussed below with a minimal emphasis on processing steps and more emphasis on device structure.

FIGS. 15–20 illustrate a method for forming a CMOS logic inverter gate 13. FIGS. 7–14 illustrate a technique wherein stacked transistors are formed one transistor at a time and with no self-alignment. FIGS. 15–20 illustrate a method wherein a plurality of transistors is formed in a stack, the transistors being self-aligned to each other. Vertical CMOS logic gates described herein may use either the self-aligned or the non-self-aligned method. In addition, the NMOS and PMOS logic gates described herein may use either the self-aligned or the non-self-aligned method.

Figure 15:
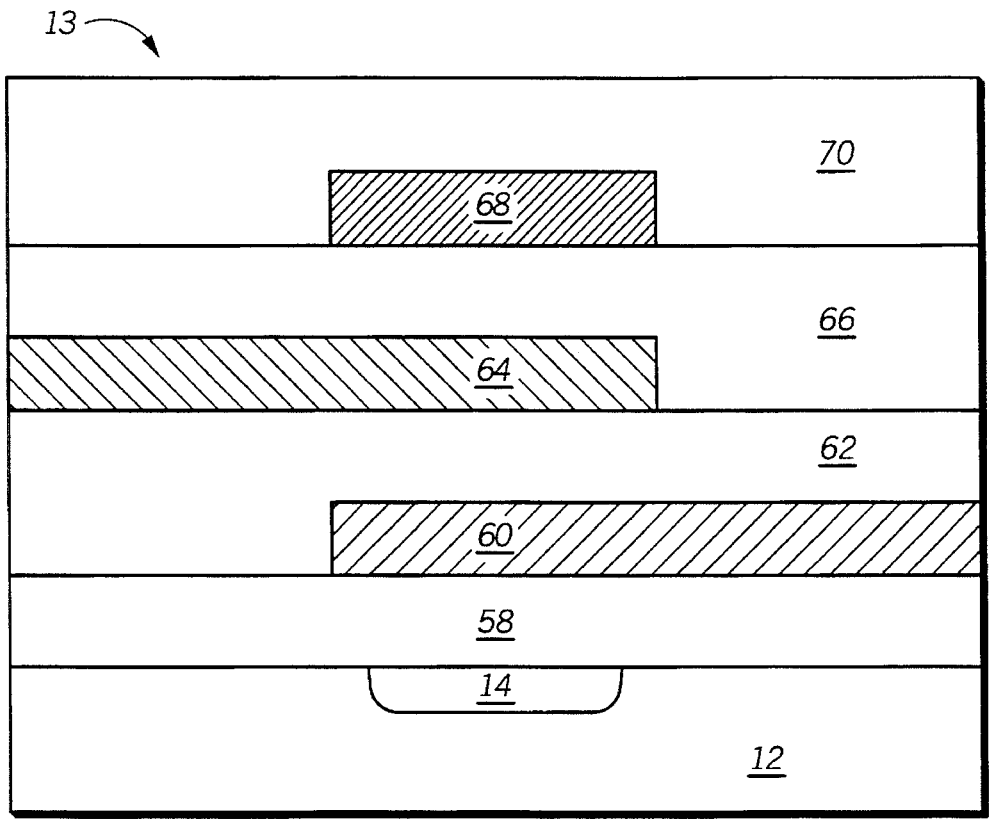
FIGS. 15–20 illustrate, in cross-sectional form, a CMOS inverter gate and method of formation using a transistor in accordance with the present invention.

In FIG. 15, substrate 12 and diffusion 14 are again illustrated. Regions and layers that are analogous to FIGS. 1–14 are again identically labeled in FIGS. 15–20. Conductive layers 60, 64, and 68 and dielectric layer 58, 62, 66, and 70 are formed overlying the substrate 12 as illustrated. The dielectric layers 58, 62, 66, and 70 are illustrated as being planar. Planarization is illustrated but is not required for a functional stacked device. Planarization will improve topography and reduce topographical problems in overlying conductive layers, such as metal layers. If a planarization method is not used, a "volcano-shaped" stacked logic device results.

Figure 16:
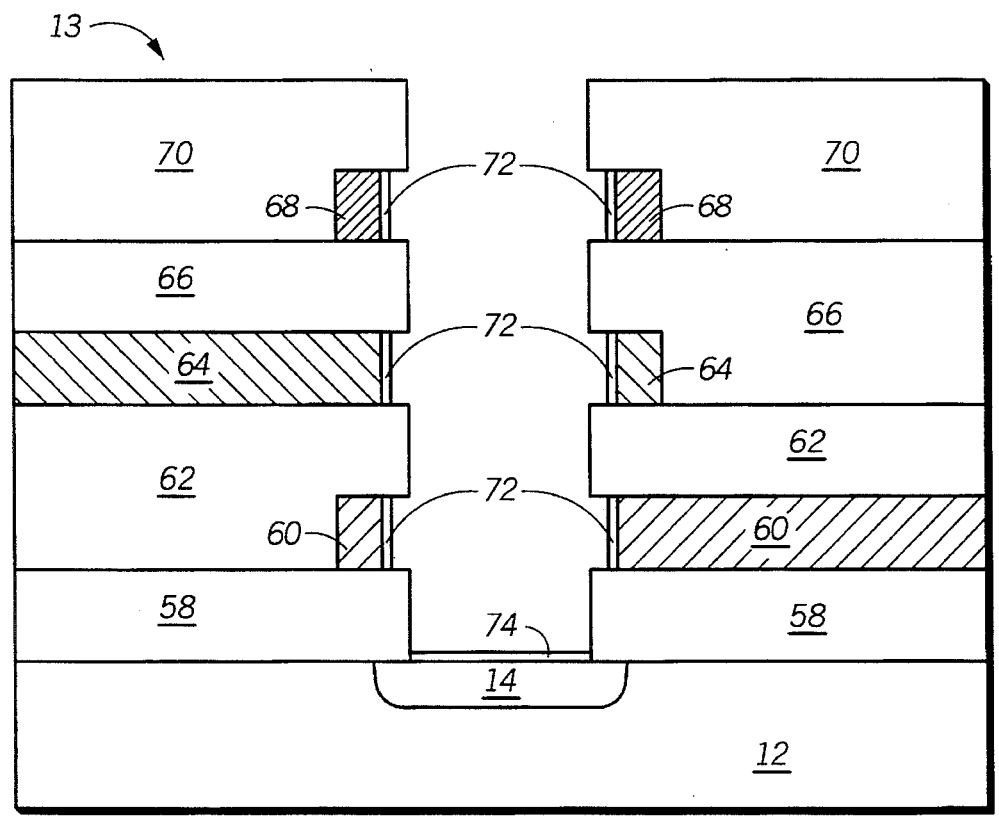

In FIG. 16, a device opening or opening is formed. The opening has sidewalls and is formed by etching portions of the conductive layers 60, 64, and 68 and dielectric layers 58, 62, 66, and 70. During the etching of the conductive layers 60, 64, and 68, the conductive layers 60, 64, and 68 are over-etched to laterally recess the sidewalls of the opening adjacent to the conductive layers 60, 64, and 68 as described in FIG. 6. This recessing allows laterally recessed sidewall dielectric layers 72 to be formed concurrently with the formation of a dielectric layer 74. Due to the fact that the dielectric layers 72 are recessed, dielectric layer 74 is etched without affecting the dielectric layers 72 as described herein.

The diffusion 14, in one form, is formed in the substrate 12 before or during formation of the conductive layers 60, 64, and 68 and dielectric layers 58, 62, 66, and 70 as illustrated in FIG. 15. In a preferred form, the diffusion 14 is formed self-aligned to the opening as in FIG. 16. In FIG. 16, all transistors that are stacked on top of one another are self-aligned to each other. Therefore, FIG. 16 illustrates a fully self-aligned process for logic stacked formations.

Figure 17:
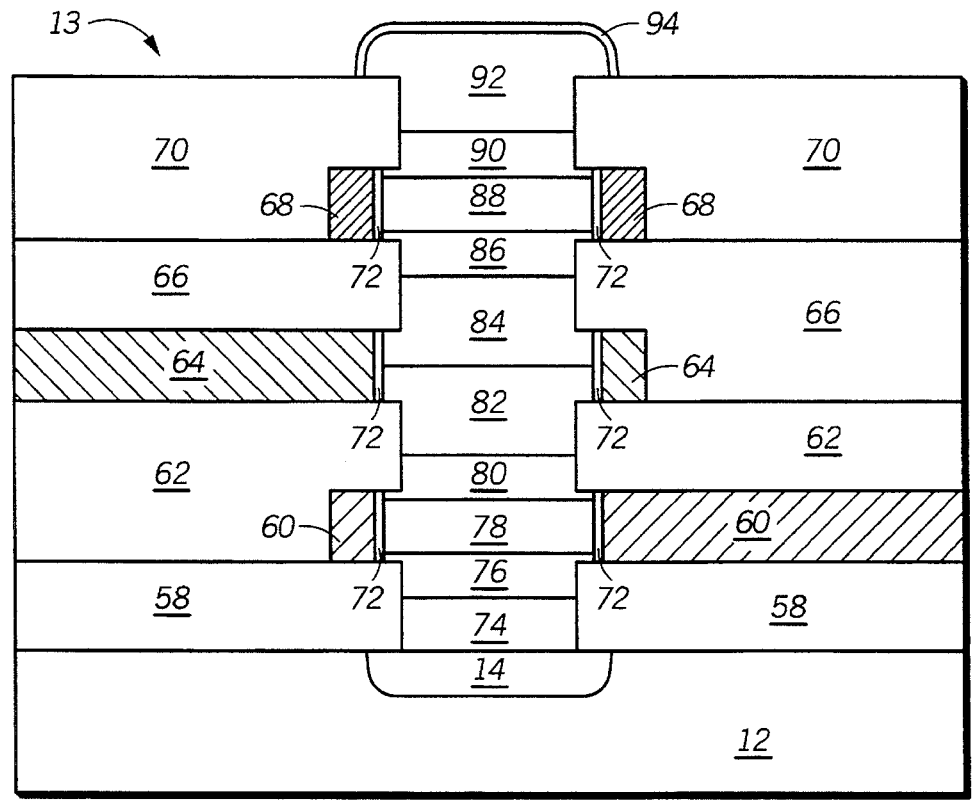

In FIG. 17, a first and a second transistor are formed one on top of the other. FIG. 17 illustrates the use of full LDD transistors. The first transistor has a first current electrode which has a lightly doped region 76 and a heavily doped region 74. The first transistor has a channel region 78. The first transistor has a second current electrode which has a lightly doped region 80 and a heavily doped region 82. A second transistor has a first current electrode which has a lightly doped region 86 and a heavily doped region 84. The second transistor has a channel region 88. The second transistor has a second current electrode which has a lightly doped region 90 and a heavily doped region 92. A dielectric layer 94 protects the heavily doped region 92 from subsequent etch processing and damage. Together, a heavily doped region and a lightly doped region form a single current electrode.

Figure 18:
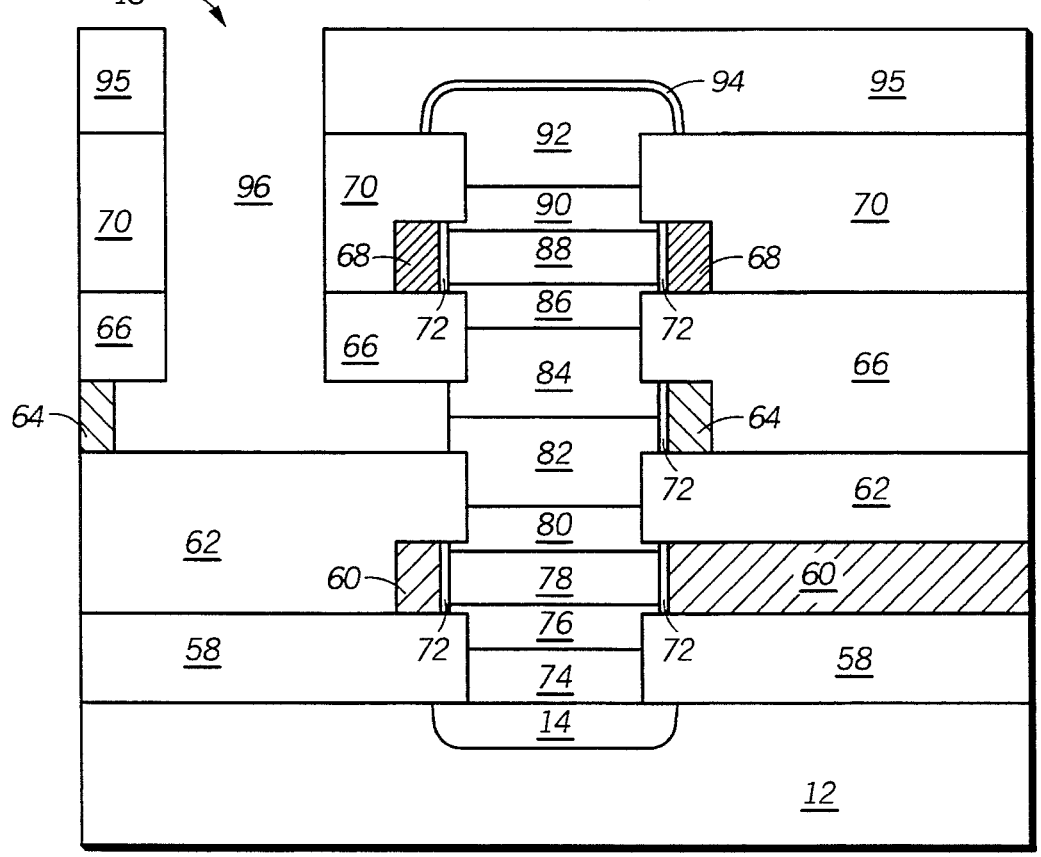

In CMOS devices, diode voltage drops (usually 0.1 V to 0.9 V) across PN junctions should be avoided. Diode voltage drops are avoided by electrically short circuiting the PN junctions with a salicide, metal or like material. FIG. 18 illustrates a method that can be used for saliciding a PN junction when a fully self-aligned process, such as the process illustrated in FIG. 15, is used. An etch hole 96 is formed that exposes the conductive layer 64. An etch step is used to remove a portion of the conductive layer 64 as illustrated in FIG. 18. A short dielectric etch is used to remove the sidewall dielectric 72 exposed by the conductive layer 64 etch. A masking layer 95, which is preferably photoresist is used to protect the dielectric layer 94. The removal of the exposed sidewall dielectric 72 exposes a portion of the heavily doped regions 82 and 84.

Figure 19:
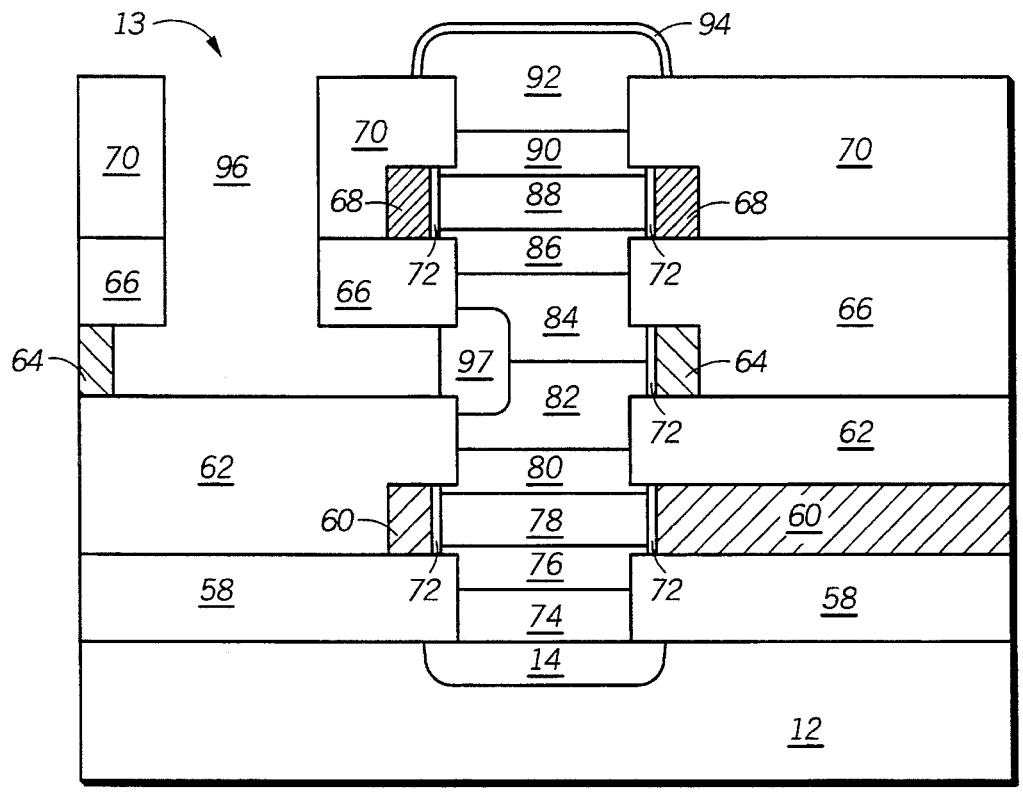

In FIG. 19, conformal CVD titanium or a like material is deposited and a salicide anneal step is performed to form a salicided region 97. An effective electrical short circuit is now bridging across the PN junction formed by the heavily doped regions 82 and 84.

Figure 20:
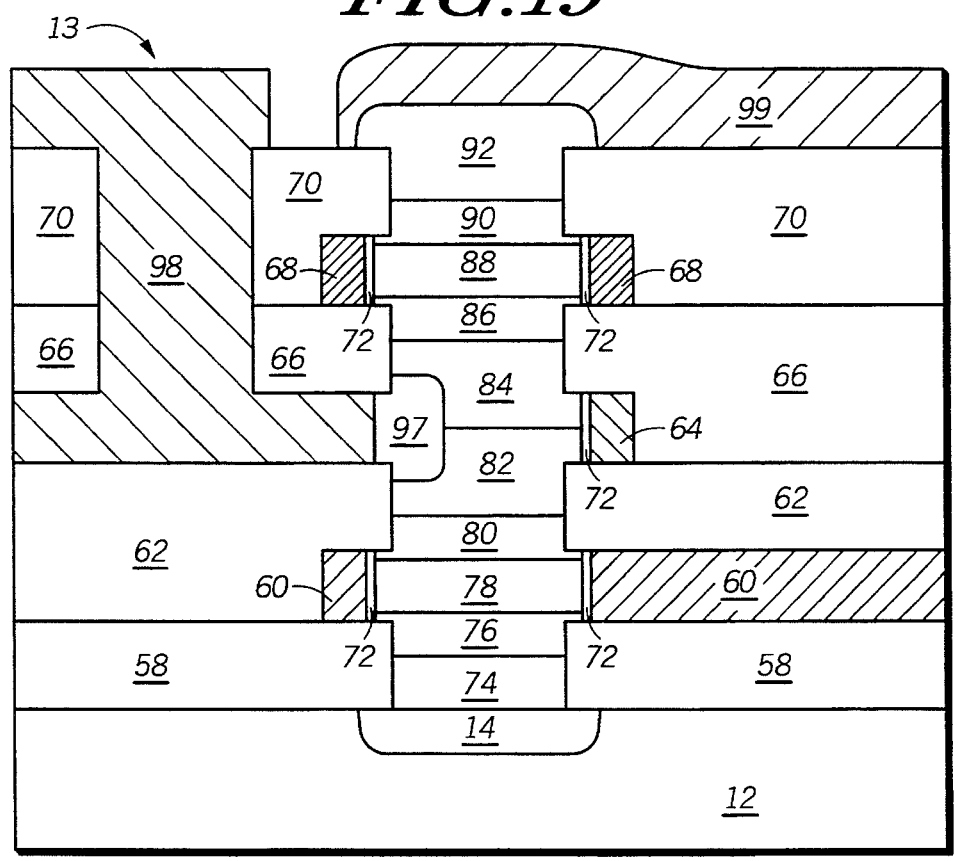

In FIG. 20, conductive regions 99 and 98 are formed to make electrical contact to the inverter gate 13. Region 98 forms an output contact of the inverter gate 13 and region 99 forms a power supply connection. In order to make electrical contact, dielectric layer 94 is removed.

It is important to note that this salicide formation step in FIGS. 18–19 is difficult because it is performed in a process that has self-aligned stacked transistors. The process of FIGS. 7–14 is more suitable for a salicide formation step due to the fact that one transistor is formed at a time. A conventional deposition, etch, and anneal cycle can form a salicide region on a first transistor's heavily doped region before the second transistor's heavily doped region is formed, thereby electrically short circuiting the resulting PN junction. The only disadvantage with this approach is that the resulting salicide region could impede epitaxial growth of conductive regions if formed over a large surface area of the heavily doped regions. Deciding one method over the other is design choice and depends upon an application of the device, available equipment, and equipment capabilities.

If the structure of FIG. 20 is electrically connected and doped in a proper manner, a CMOS inverter results. For a CMOS inverter to operate, the first transistor or bottom transistor should be an N-channel transistor wherein the current electrodes are N type. The second transistor or top transistor should be a P-channel transistor wherein the current electrodes are P type.

The diffusion 14 is connected to a ground potential or a reference voltage terminal, and the heavily doped current region 92 is connected to a power supply potential or a power supply terminal. The conductive layers 60 and 68 are either connected or routed together to carry a logic signal A or individually carry the same logic signal A from different sources. The conductive layer 98 or a conductive layer connected to either of the heavily doped regions 82 or 84 carries the output signal of the CMOS inverter gate 13.

It is intended that the information in FIGS. 1–14 may be applied in an analogous manner to form other CMOS gates such as inverters, NAND gates, and the like. In addition, the formation of N input gates, such as three-input CMOS NOR gates, and three-input NAND gates, should be apparent given the information disclosed in FIGS. 1–20. To create inverters, NAND gates, and the like, the circuit interconnections will change, the number of stacked transistors will vary, and the number of gates per transistors will change, but the processing should be similar to the processes and information illustrated in FIGS. 1–20. Therefore, subsequent CMOS device structures are discussed in detail with minimal emphasis on processing steps.

In some cases, the diffusion 14 is referred to as a first conductor, the layer 99 is referred to as a second conductor, the layer 60 which is positioned away from layer region 78 is referred to as a first input conductor or input conductor since it provides an input signal as taught herein, the layer 68 is referred to as a second input conductor or input conductor since it provides an input signal as taught herein, the layer 98 is referred to as output conductor, and portions of the layers 60 and 68 which affect current through regions 78 and 88 respectively are referred to as first and second control electrodes or control electrodes. These portions of the layers 60 and 68 which affect current through regions 78 and 88 are usually the portions of layers 60 and 68 which are closest to the channel regions 78 and 88. In addition, the connection of two or more regions of material are referred to as a node. Therefore, the connection of region 84 to region 82 in FIG. 20 is a node and the connection of region 97 to layer 98 is a node, etc. This terminology may easily be used to describe other structures and areas in the FIGS. 1–42.

Figure 21:
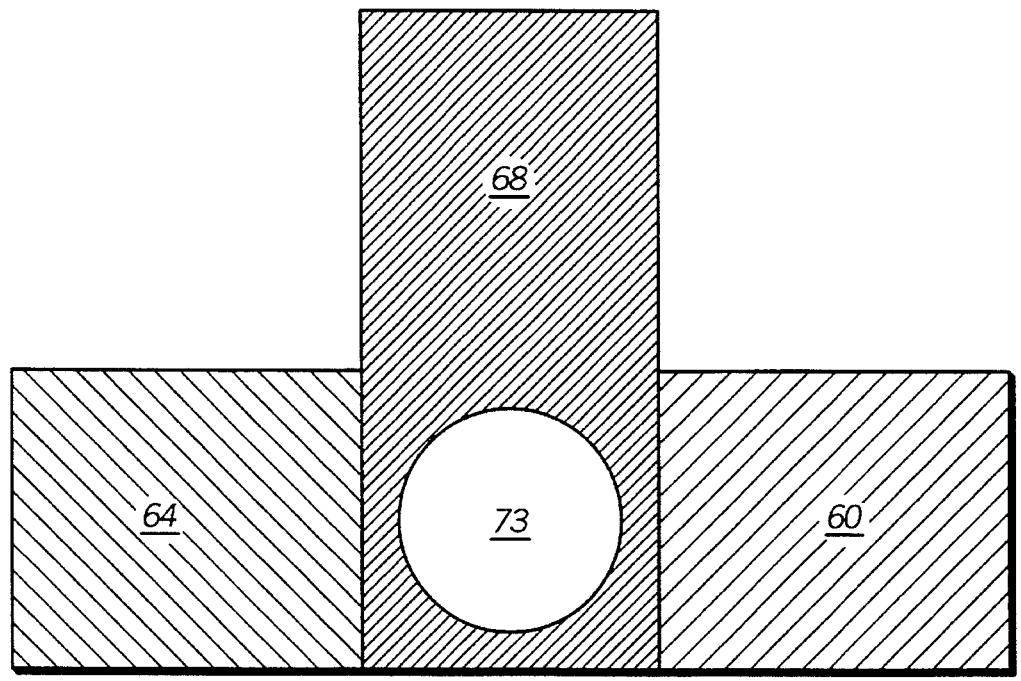
FIG. 21 illustrates, in top perspective view, the CMOS inverter gate of FIG. 20.

In FIG. 21, the CMOS inverter gate 13 of FIG. 20 is illustrated in a top perspective view. Only conductive layers 60, 64, and 68 are illustrated along with the opening which is illustrated in FIG. 21 as opening 73.

Figure 22:
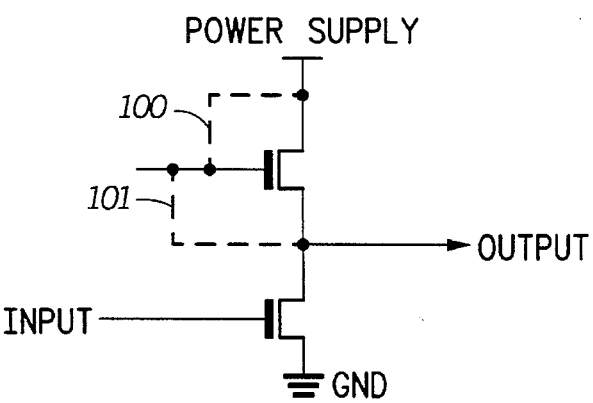
FIG. 22 illustrates, in schematic form, a conventional MOS inverter gate.

In FIG. 22 a known MOS inverter circuit is schematically illustrated. A connection 100 is made if the top transistor, which functions as a resistive load device, is an enhancement mode transistor. The connection 101 is made if the top transistor is a depletion mode transistor.

Figure 23:
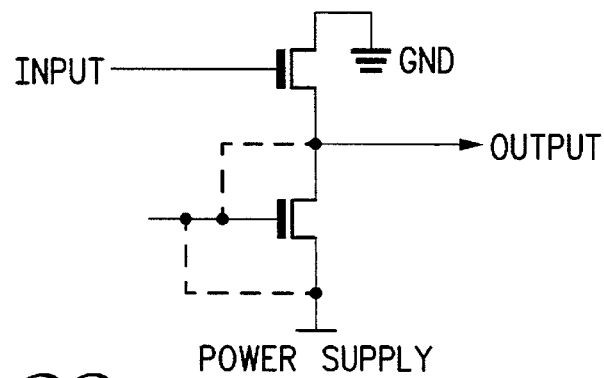
FIG. 23 illustrates, in schematic form, an alternative conventional MOS inverter gate.

In FIG. 23 a second known MOS inverter circuit is schematically illustrated. The same enhancement and depletion transistor connections for a load transistor is illustrated but not labeled. FIG. 23 is FIG. 22 flipped upside down. From a circuit operation standpoint, FIGS. 22 and 23 are equivalent, but FIGS. 22 and 23 each result in two different inventive stacked transistor structures.

Figure 24:
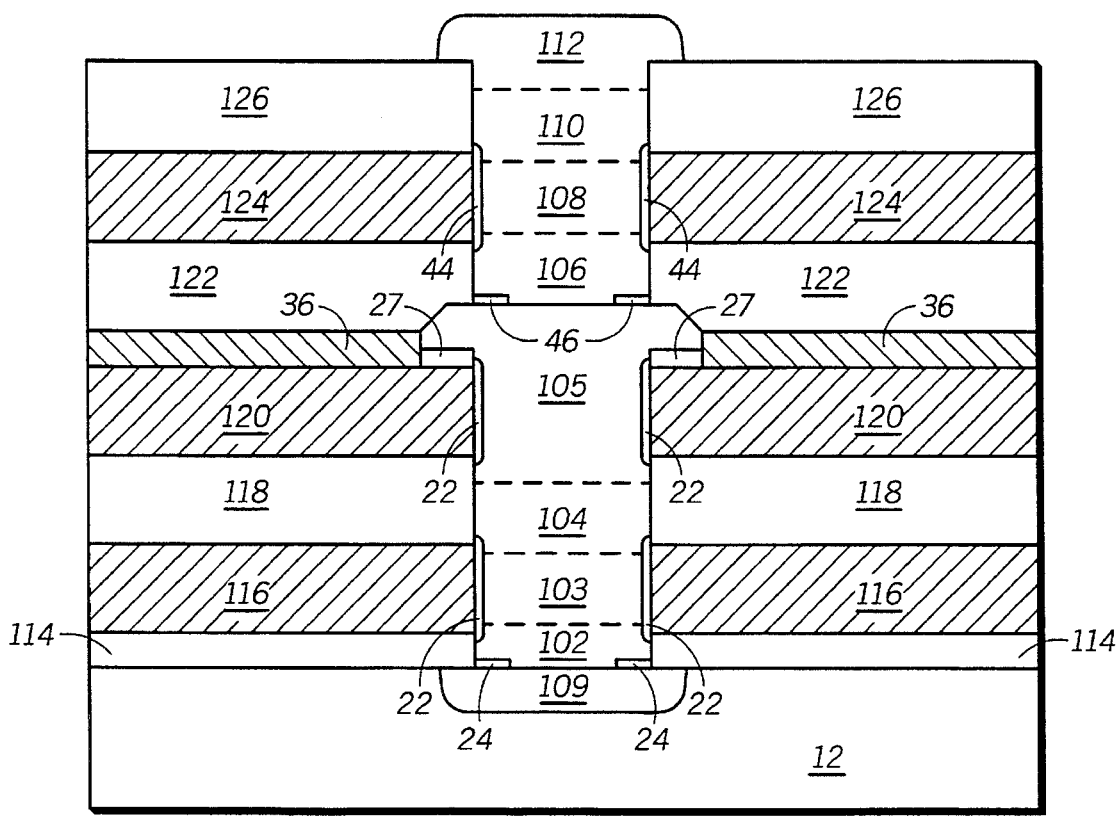
FIG. 24 illustrates, in cross-sectional form, an MOS inverter gate in accordance with the present invention.

FIG. 24 illustrates a cross section of a stacked MOS inverter in accordance with the present invention. From the descriptions of FIGS. 1–20, the inventive methods and steps of forming of the structure of FIG. 24 should be apparent. Analogous elements of previous figures are number the same. FIG. 24 again has a substrate 12. A diffusion 109 is formed within the substrate 12. A bottom first transistor has a single gate conductive layer 116, a first current electrode 102, a channel region 103, a lightly doped region 104, a heavily doped region 105, an output conductive layer 120, and dielectric layers 114 and 118. An overlying second transistor has a single gate conductive layer 124, a first current electrode 106, a channel region 108, a lightly doped region 110, a heavily doped region 112, and dielectric layers 122 and 126. Regions and layers in subsequent figures that are analogous functionally to regions and layers in prior figures are either identically labeled or not labeled.

In order to form the inverter of FIG. 22, heavily doped region 112 is connected or routed to a power supply potential or terminal. The diffusion 109 is connected or routed to a ground potential or a reference voltage terminal. Either the region 105, the current electrode 106, or the output conductive layer 120 carries an inverter output signal. The conductive layer 116 is wired to carry an input logic signal. The conductive layer 124 is either connected to the heavily doped region 112 if the second transistor is an enhancement mode transistor or connected to the output conductive layer 120 if the second transistor is a depletion mode transistor. Depletion mode or enhancement mode operation is determined primarily by in-situ doping concentrations during channel region formation.

In order to form the inverter of FIG. 23, heavily doped region 112 is connected or routed to a ground potential or a reference voltage terminal. The diffusion 109 is connected or routed to a power supply potential or terminal. Either the region 105, the current electrode 106, or the output conductive layer 120 carries an inverter output signal. The conductive layer 124 is connected to an input logic signal A. The conductive layer 116 is either connected to the diffusion 109 if the second (bottom) transistor is an enhancement mode transistor or connected to the output conductive layer 120 if the second (bottom) transistor is a depletion mode transistor.

In either case of FIG. 22 or FIG. 23, both the transistors of FIG. 24 are either formed as N-channel transistors for NMOS logic or as P-channel transistors for PMOS logic.

Figure 25:
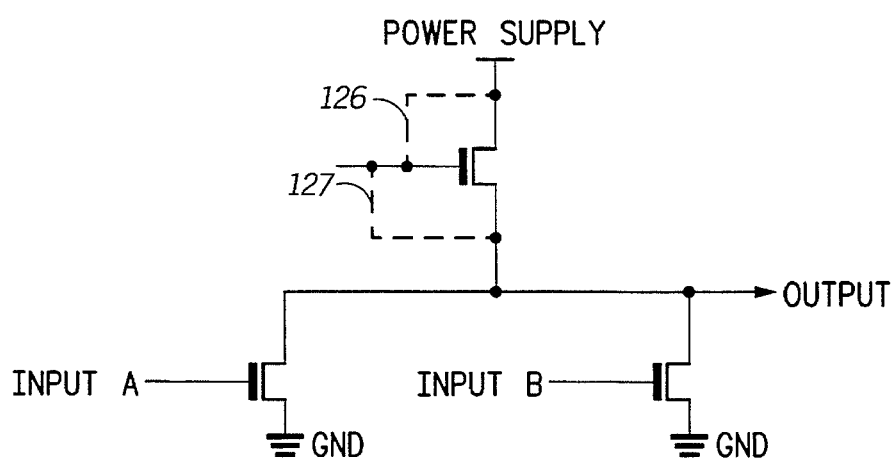
FIG. 25 illustrates, in schematic form, a conventional MOS NOR gate.

In FIG. 25, a known MOS NOR gate is schematically illustrated. Due to the fact that the NOR gate process flow was presented herein, the device explanation will be brief. In FIG. 25, either a connection 126 or a connection 127 is used to connect a transistor functioning as resistive load device depending upon enhancement or depletion mode transistor operation.

Figure 26:
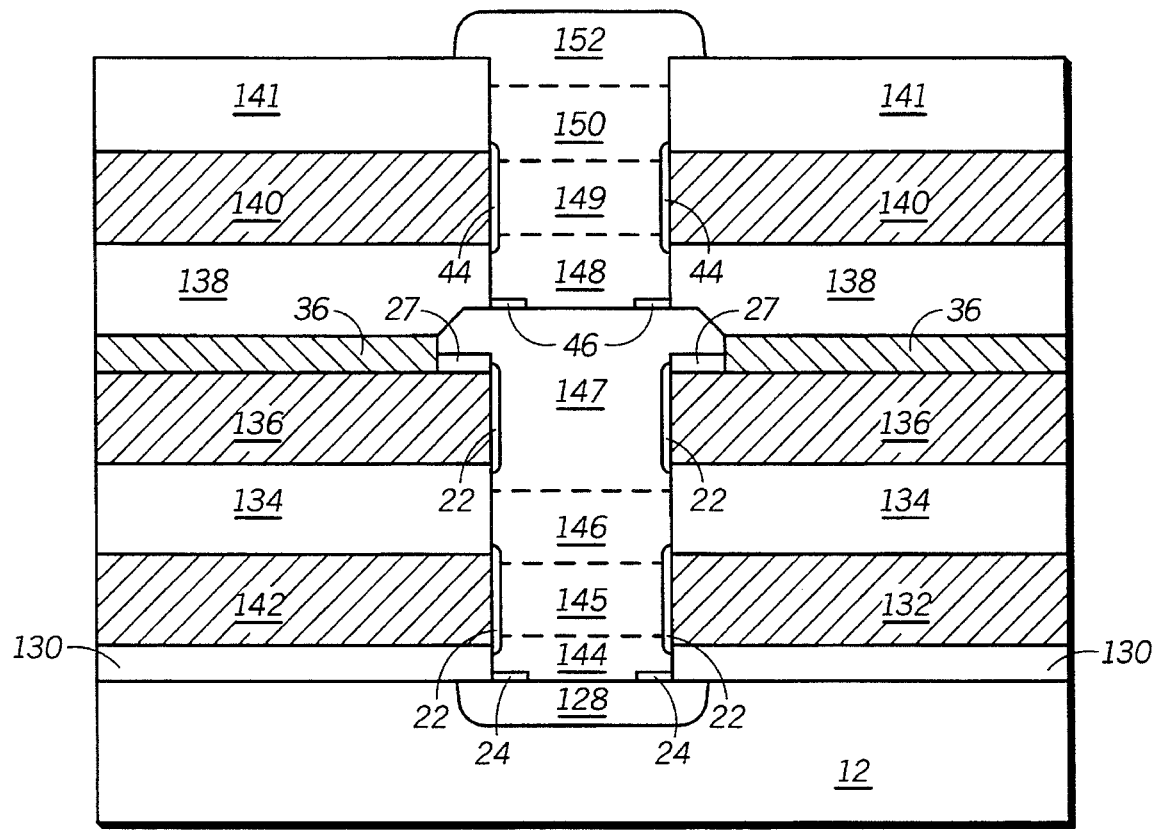
FIG. 26 illustrates, in cross-sectional form, an MOS NOR gate in accordance with the present invention.

In FIG. 26, a NOR gate is schematically illustrated which has substrate 12 and a diffusion 128. A bottom or first transistor is double-gated and has two gate conductive layers 142 and 132, an output conductive layer 136, a first current electrode 1, a channel region 145, a lightly doped drain region 146, a heavily doped drain region 147, and dielectric layers 130 and 134. A top or second transistor is single-gated and has one gate conductive layer 140, a first current electrode 148, a channel region 149, a lightly doped drain region 150, a heavily doped drain region 152, and dielectric layers 138 and 141.

In order to function as the NOR gate of FIG. 25, the heavily doped drain region 152 is connected or routed to a power supply potential or terminal. The diffusion 128 is connected or routed to a ground potential or a reference voltage terminal. The heavily doped drain region 147, the current electrode 148, or the conductive layer 136 communicates an output signal of the NOR gate. The conductive gate 142 is connected to a first input signal A or acts as a first input conductor, and conductive gate 132 is connected to a second input signal B or acts as a second input conductor. The output conductive layer 136 provides the output logic signal (A NOR B).

The second transistor is connected as described herein for depletion or enhancement operation as is appropriate. In addition, both PMOS and NMOS NOR gates are possible by varying or changing the doping conductivity type as described herein.

Figure 27:
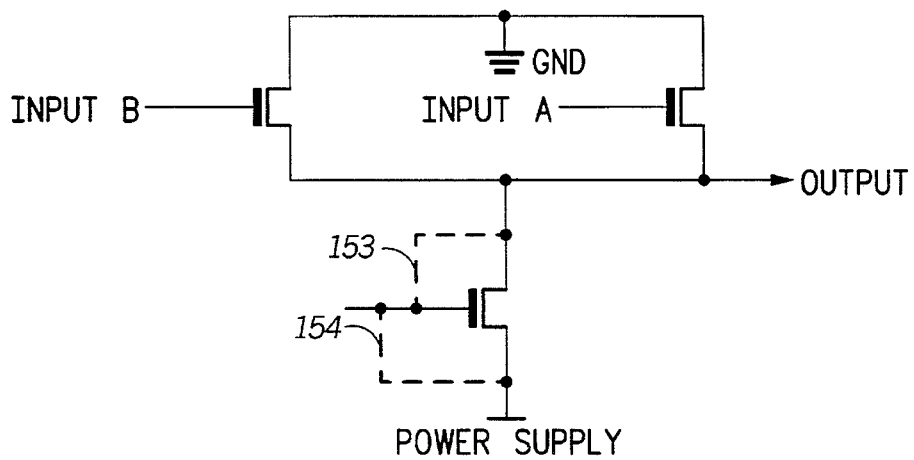
FIG. 27 illustrates, in schematic form, an alternative conventional MOS NOR gate.

In FIG. 27 an alternative known NOR circuit is schematically illustrated. Once again, depletion mode and enhancement mode connections are respectively illustrated via the connections 153 and 154 for a transistor which functions as a load device.

Figure 28:
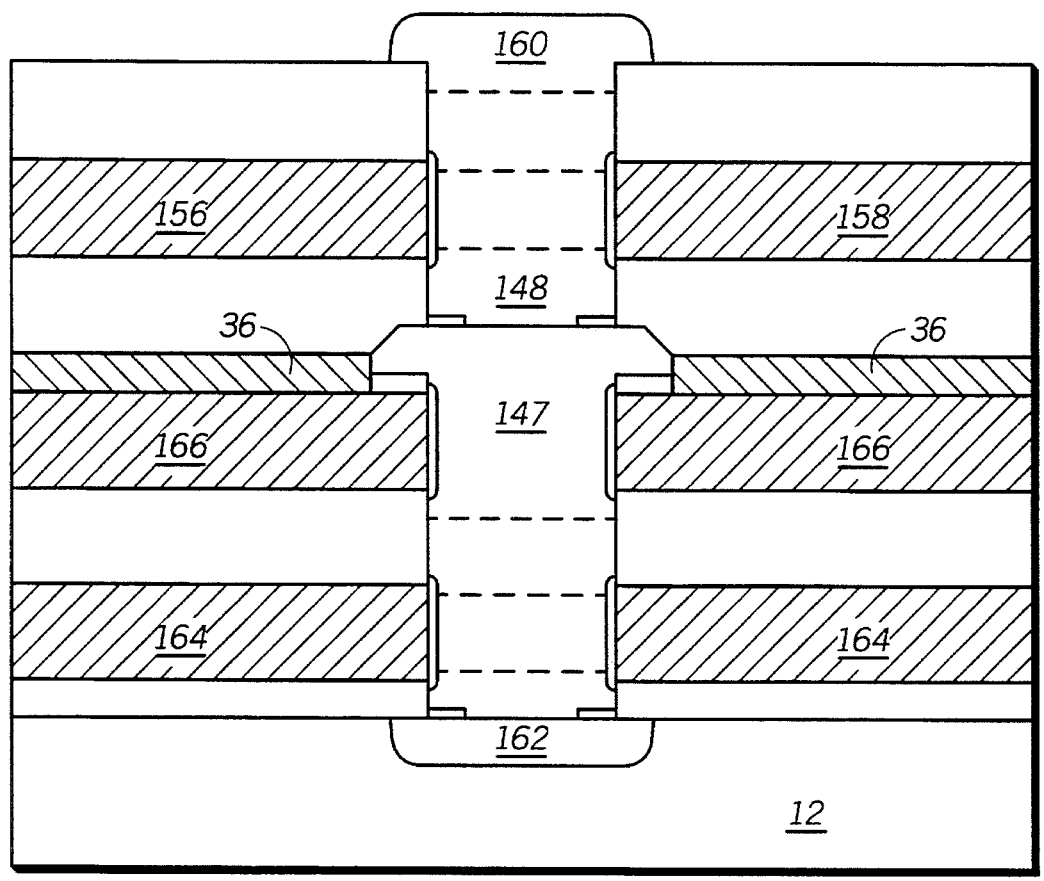
FIG. 28 illustrates, in cross-sectional form, another MOS NOR gate in accordance with the present invention.

In FIG. 28, a NOR gate in accordance with FIG. 27 is illustrated which has substrate 12 and a diffusion 162. A bottom or first transistor is single-gated by one gate conductive layer 164, has an output conductive layer 166, and has the appropriate LDD regions, electrodes, and a channel region. A top or second transistor is double-gated and has two gate conductive layers 156 and 158, and all of the appropriate LDD regions, electrodes, and a channel region.

In order to function as the NOR gate of FIG. 25, a heavily doped drain region 160 is connected or routed to a ground potential or a reference voltage terminal. The diffusion 162 is connected or routed to a power supply potential or terminal. A heavily doped drain region 147 of the first transistor, a first current electrode 148 of the second transistor, or the conductive layer 166 communicates an output signal of the NOR gate. The conductive gate 156 is connected to a first input signal A or acts as a first input conductor, and conductive gate 158 is connected to a second input signal B or acts as a second input conductor. The output conductive layer 166 provides the logic signal (A NOR B).

The first transistor is connected as described herein for depletion or enhancement operation as is appropriate. In addition, both PMOS and NMOS NOR gates are possible by varying or changing the doping conductivity type.

Figure 29:
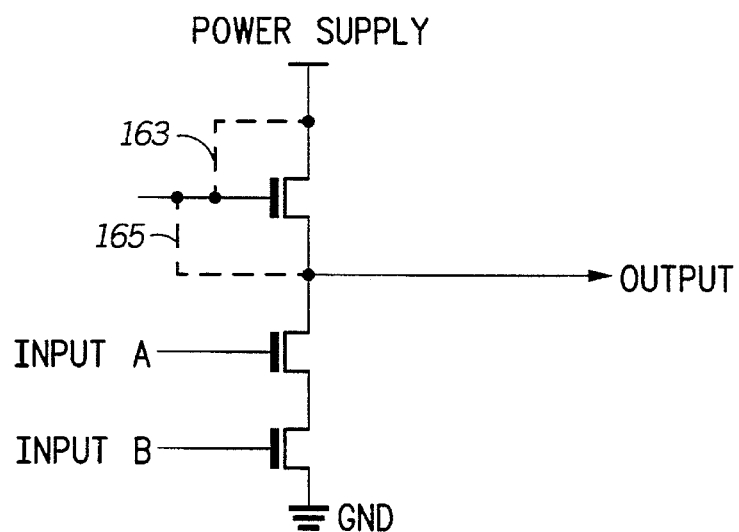
FIG. 29 illustrates, in schematic form, a conventional MOS NAND gate.

In FIG. 29 a known NAND circuit is schematically illustrated. Once again, depletion mode and enhancement mode connections are respectively illustrated via he connections 163 and 165 for a transistor which function as a resistive load device.

Figure 30:
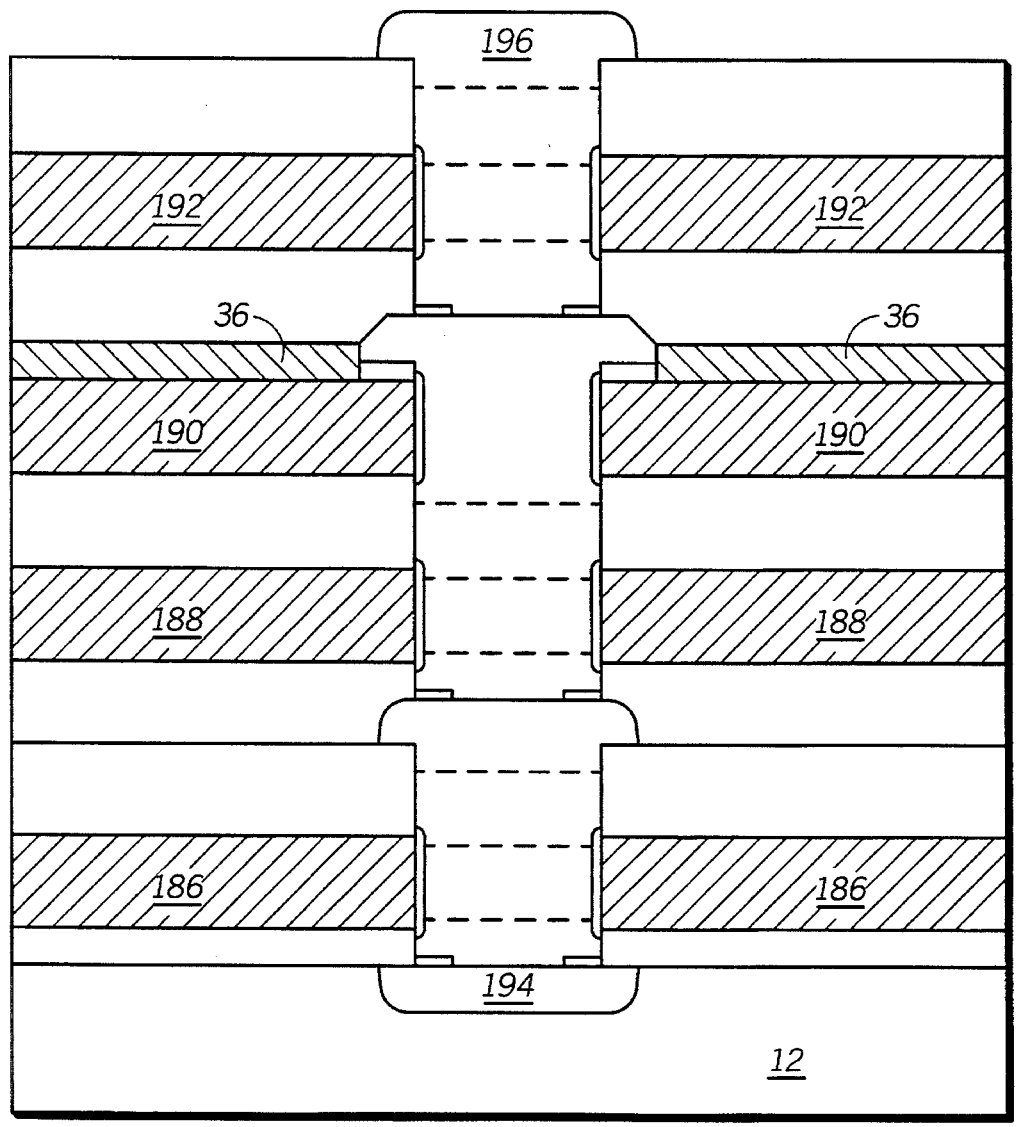
FIG. 30 illustrates, in cross-sectional form, an MOS NAND gate in accordance with the present invention.

In FIG. 30, a structure suitable for forming a NAND gate in accordance with FIG. 29 is illustrated which has substrate 12 and a diffusion 194. A bottom or first transistor is single-gated by one gate conductive layer 186, and has the appropriate LDD regions, electrodes, and a chapel region. A middle or second transistor is single-gated and has one gate conductive layer 188, an output conductive layer 190, and all of the appropriate LDD regions, electrodes, and a channel region. A top or third transistor is single-gated and has one gate conductive layer 192, and all of the appropriate LDD region, electrodes, and a channel region.

In order to function as the ND gate of FIG. 29, a heavily doped drain region 196 is connected or routed to a power supply potential or terminal. The diffusion 162 is connected or routed to a ground potential or a reference voltage terminal. The heavily doped drain region of the second transistor, the first current electrode of the third transistor, or the conductive layer 190 communicates an output signal of the NAND gate. The conductive gate 186 is connected to a first input signal A or acts as a first input conductor, and conductive gate 88 is connected to a second input signal B or acts as a second input conductor. The output conductive layer 190 provides the output logic signal (A NAND B).

The third transistor is connected as described herein for depletion or enhancement operation as is appropriate. In addition, both PMOS and NMOS NOR gates are possible by varying or changing the doping conductivity type.

Figure 31:
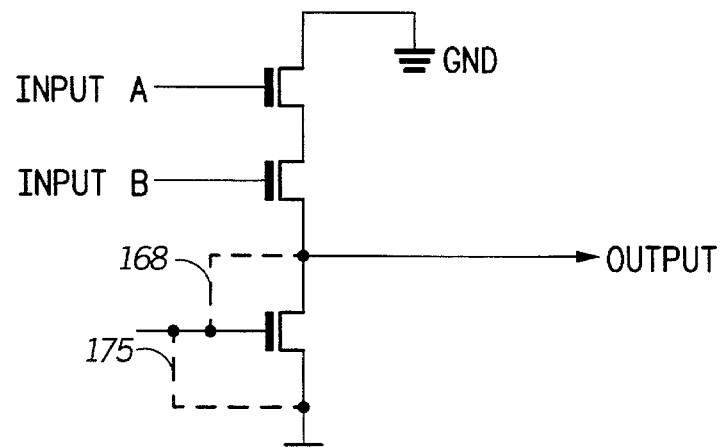
FIG. 31 illustrates, in schematic form, an alternative conventional MOS NAND gate.

In FIG. 31 an alternative own NAND circuit is schematically illustrated. Once again, depletion mode and enhancement mode connections are respectively illustrated via the connections 168 and 175 for a transistor which functions as a resistive load device.

Figure 32:
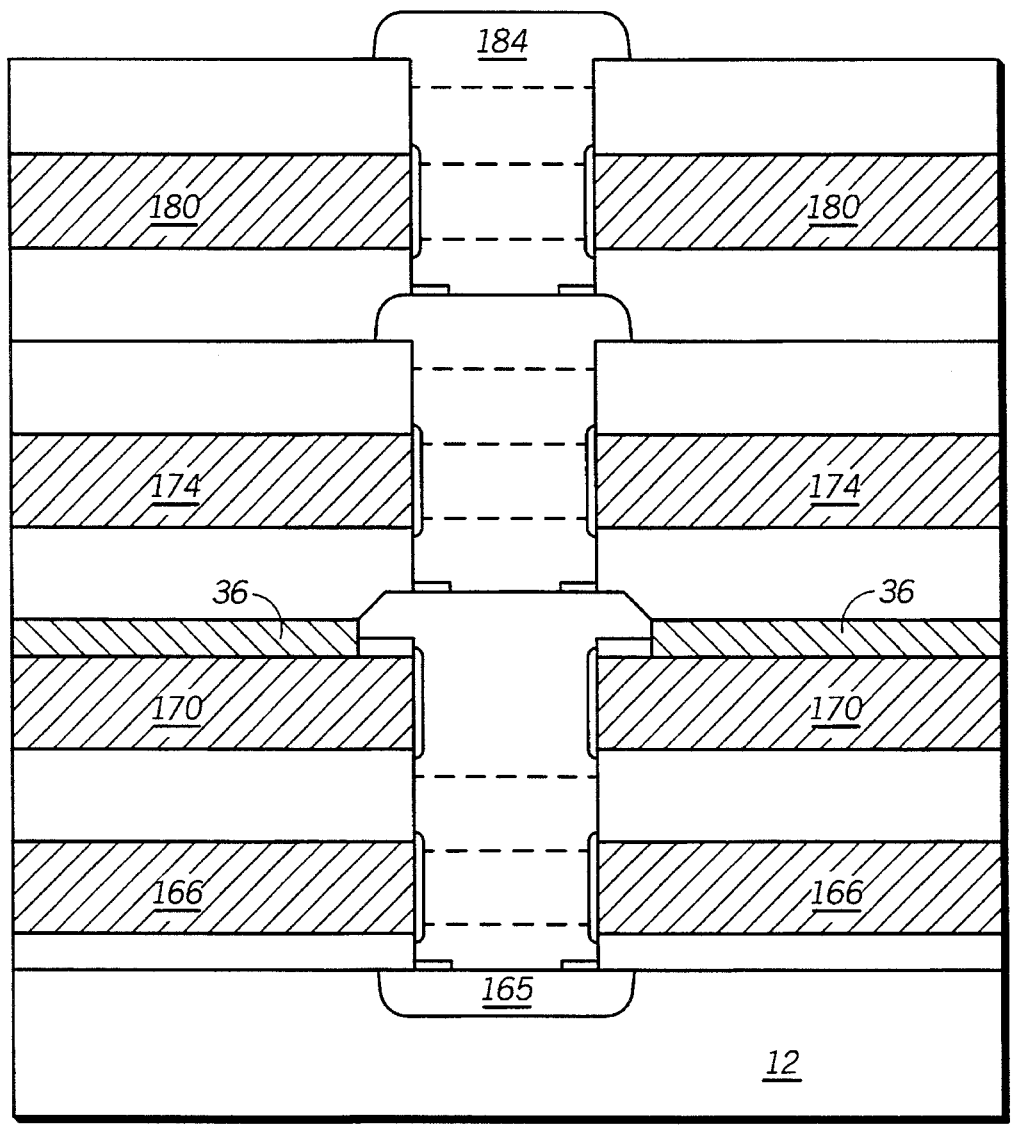
FIG. 32 illustrates, in cross-sectional form, an MOS NAND gate in accordance with the present invention.

In FIG. 32, a structure suitable for forming a NAND gate in accordance with FIG. 31 is illustrated which has substrate 12 and a diffusion 165. A bottom or first transistor is single-gated by one gate conductive layer 166, has an output conductive layer 170, and has the appropriate LDD regions, electrodes, and a channel region. A middle or second transistor is single-gated and has one gate conductive layer 174, and all of the appropriate LDD regions, electrodes, and a channel region. A top or third transistor is single-gated and has one gate conductive layer 180, and all of the appropriate LDD regions, electrodes, and a channel region.

In order to function as the NAND gate of FIG. 31, a heavily doped drain region 184 is connected or routed to a ground potential or a reference voltage terminal. The diffusion 162 is connected or routed to a power supply potential or terminal. The heavily doped drain region of the first transistor, the first current electrode of the second transistor, or the conductive layer 170 communicates an output signal of the NAND gate. The conductive gate 174 is connected to a first input signal A or acts as a first input conductor, and conductive gate 180 is connected to a second input signal B or acts as a second input conductor. The output conductive layer 170 provides the logic signal (A NAND B).

The first transistor is connected as described therein for depletion or enhancement operation as is appropriate. In addition, both PMOS and NMOS NOR gates are possible by varying or changing the doping conductivity type.

Figure 33:
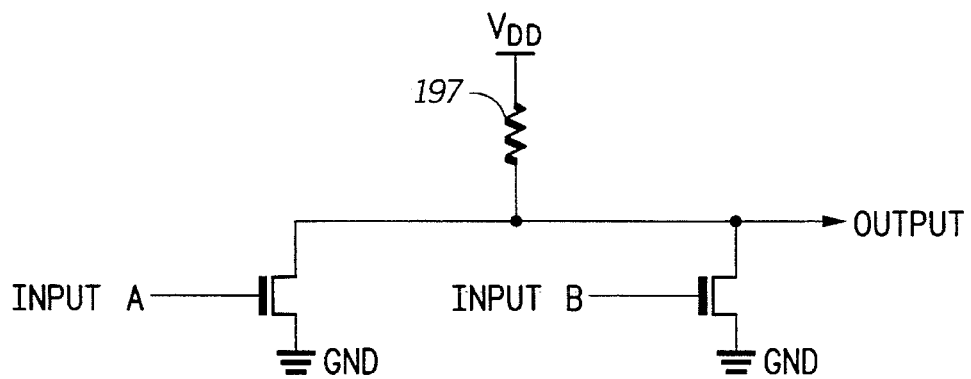
FIG. 33 illustrates, in schematic form, a conventional resistive pull-up MOS NOR gate.

In FIG. 33 an alternative known resistive pull-up NOR circuit is schematically illustrated. In some cases, a depletion mode or an enhancement mode transistor is replaced with a resistive device or resistor 197.

Figure 34:
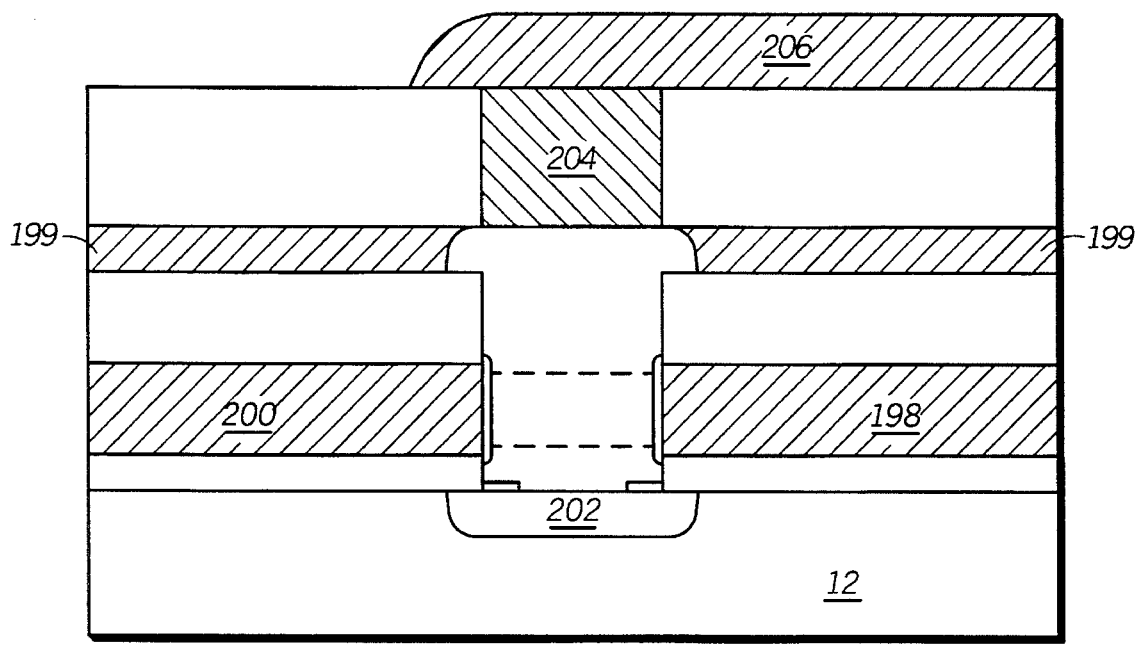
FIG. 34 illustrates, in cross-sectional form, a resistive pull-up MOS NOR in accordance with the present invention.

In FIG. 34, a structure suitable for forming a NOR gate in accordance with FIG. 33 is illustrated which has substrate 12 and a diffusion 202. A single transistor or first transistor is double-gated by two gate conductive layers 200 and 198. An output conductive layer 199 connects to the first transistor, and the first transistor has the appropriate LDD regions, electrodes, and a channel region. A resistive grown region 204 or plug is illustrated in FIG. 34. A resistive layer 206 is also illustrated. In general, only one of the resistive layer 206 or region 204 is required to create resistance, but both may be used if a large resistance is desired or an application requires both to be used. It should be apparent that the resistive pull-up device presented in FIG. 34 can easily be applied to NAND gates, inverters, and other logic gates as well as NOR gates.

Figure 35:
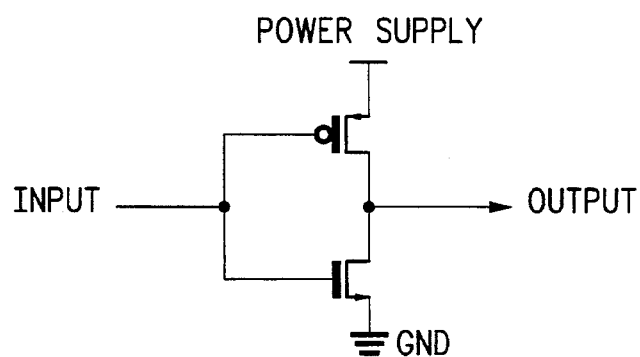
FIG. 35 illustrates, in schematic form, a conventional CMOS inverter gate.

In FIG. 35 a known CMOS inverter circuit is schematically illustrated. The upper transistor is a P-channel device and the lower transistor is an N-channel device.

In FIG. 20, the previously described structure is also suitable for forming the inverter gate 13 of FIG. 20. Due to the fact that the formation of inverter gate 13 of FIG. 20 was presented earlier, only a discussion of interconnections will follow.

In order for the inverter of FIG. 20 to function as the inverter gate of FIG. 35, the heavily doped drain region 92 is connected or routed to a power supply potential or terminal. The diffusion 14 is connected or routed to a ground potential or a reference voltage terminal. The heavily doped region 82 of the first transistor, the heavily doped region 84 of the second transistor, or the conductive layer 98 provides an output signal of the inverter gate. The conductive gates 60 and 68 are connected to an input signal or act as a first input conductor. The output conductive layer 98 provides the inverted logic output signal. The first transistor or bottom transistor is an N-channel device, and the second transistor or top transistor is a P-channel device.

Figure 36:
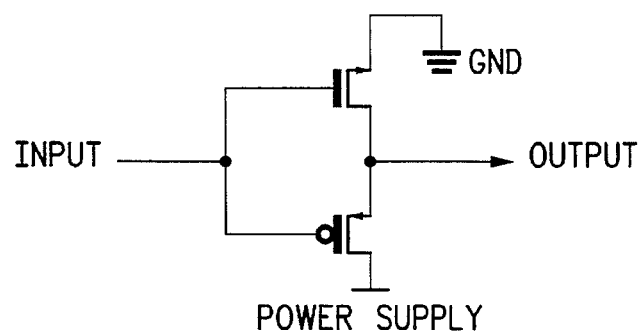
FIG. 36 illustrates, in schematic form, an alternative conventional CMOS inverter gate.

In FIG. 36 an alternative known CMOS inverter circuit is schematically illustrated. The upper transistor is an N-channel device and the lower transistor is a P-channel device.

In order for FIG. 20 to function as the inverter gate of FIG. 36, the heavily doped drain region 92 is connected or routed to a ground potential or a reference voltage terminal. The diffusion 14 is connected or routed to a power supply potential or terminal. The heavily doped drain region 82 of the first transistor, the heavily doped drain region 84 of the second transistor, or the conductive layer 98 provides an output signal of the inverter gate. The conductive gates 60 and 68 are connected to an input signal or act as a first input conductor. The output conductive layer 98 provides the inverted output logic signal. The first transistor or bottom transistor is a P-channel device, and the second transistor or top transistor is an N-channel device.

Figure 37:
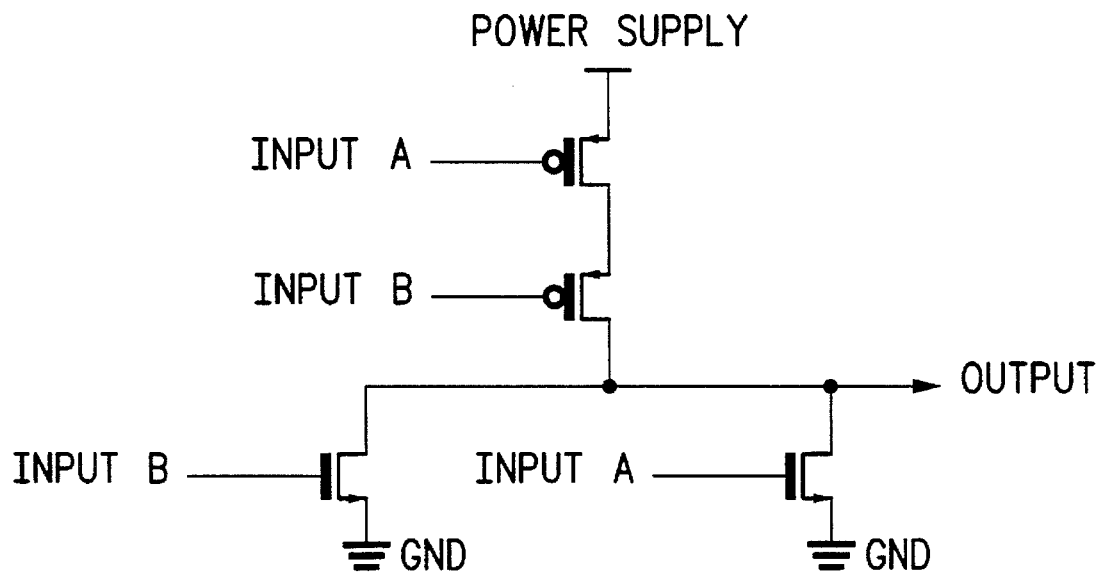
FIG. 37 illustrates, in schematic form, a conventional CMOS NOR gate.

In FIG. 37 a known CMOS NOR circuit is schematically illustrated. The lower two transistors are N-channel devices and the upper two transistors are P-channel devices.

Figure 38:
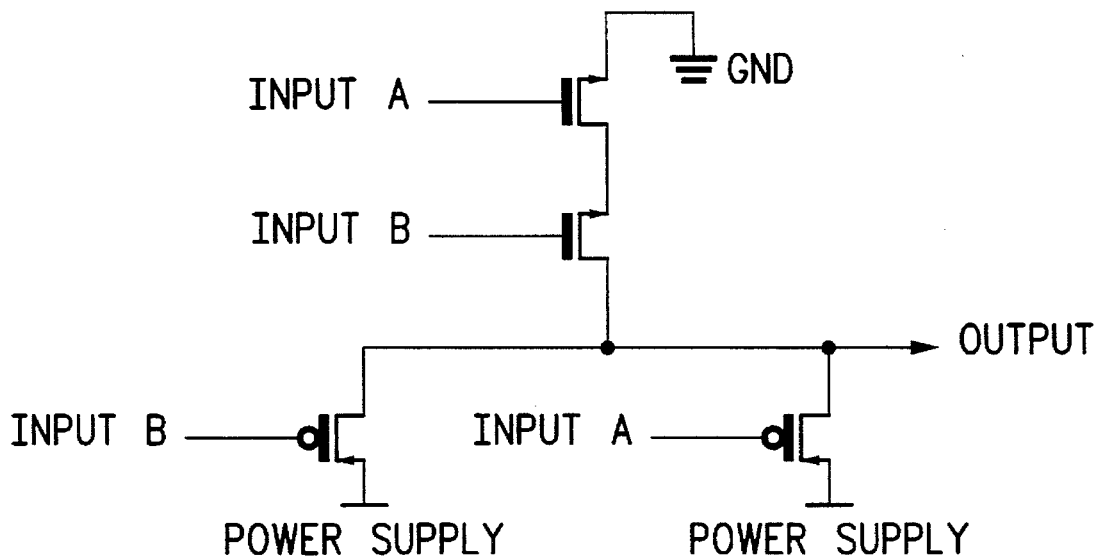
FIG. 38 illustrates, in schematic form, a conventional CMOS NAND gate.

In FIG. 38 a known CMOS NAND circuit is schematically illustrated. The lower two transistors are P-channel devices and the upper two transistors are N-channel devices.

Figure 39:
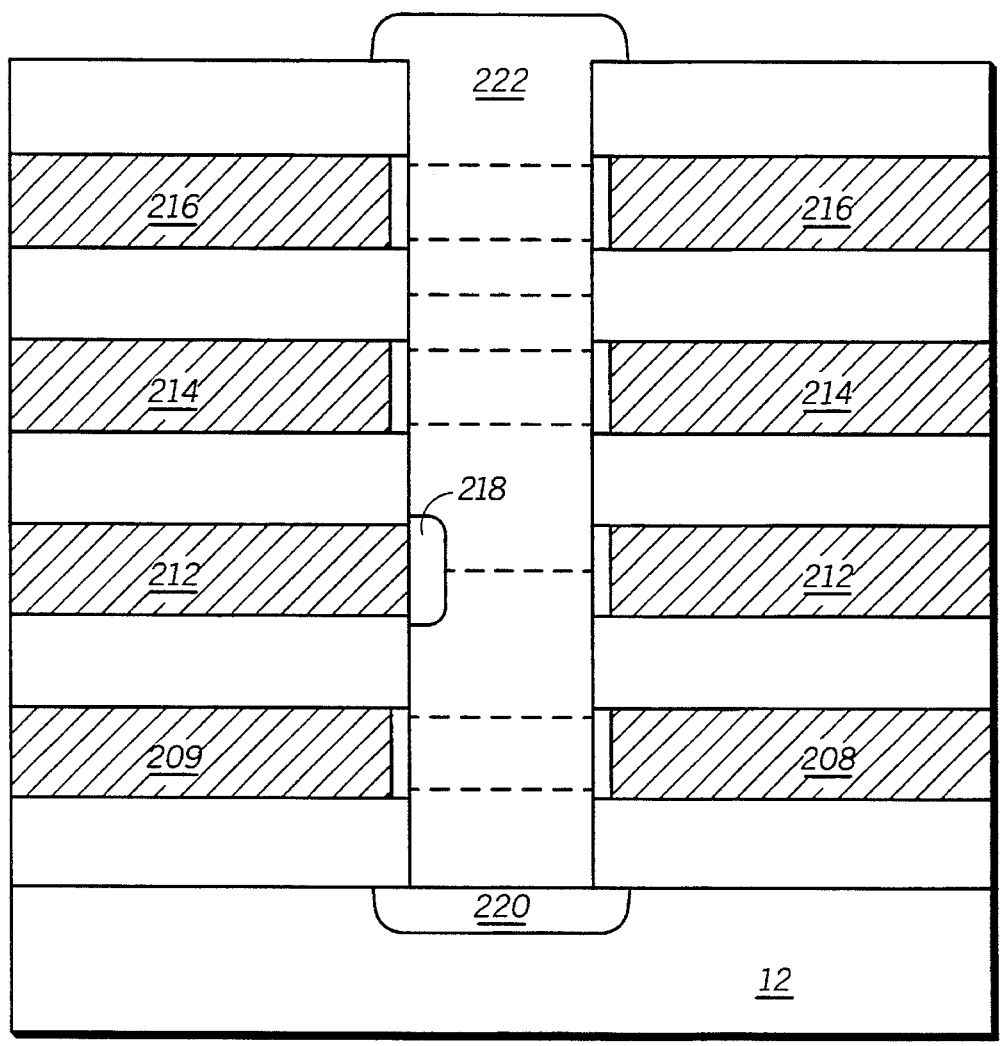
FIG. 39 illustrates, in cross-sectional form, a structure suitable for formation of a NOR gate or a NAND gate in accordance with the present invention.

In FIG. 39, a structure suitable for forming either the CMOS NAND gate in accordance with FIG. 38 or the CMOS NOR gate in accordance with FIG. 37 is illustrated. FIG. 39 has substrate 12 and a diffusion 220. A bottom or first transistor is double-gated by gate conductive layers 208 and 209, has an output conductive layer 212, has a salicided region 218, and has the appropriate LDD regions, electrodes, and a channel region. A middle or second transistor is single-gated and has one gate conductive layer 214, and all of the appropriate LDD regions, electrodes, and a channel region. A top or third transistor is single-gated and has one gate conductive layer 216, and all of the appropriate LDD regions, electrodes, and a channel region.

In order to function as the NOR gate of FIG. 37, a heavily doped drain region 222 is connected or routed to a power supply potential or terminal. The diffusion 220 is connected or routed to a ground potential or a reference voltage terminal. The second current electrode of the first transistor, the first current electrode of the second transistor, or the conductive layer 212 provides an output signal of the NOR gate. The conductive gate layers 214 and 209 are connected to a first input signal A or act as first input conductors, and conductive gates 216 and 208 are connected to a second input signal B or act as second input conductors. The output conductive layer 212 provides the output logic signal (A NOR B). It should be apparent that the logic signals A and B can be connected to the illustrated input conductive layers in different orders. It is known that the inputs to a NAND gate, a NOR gate, and the like are, from a functional logic standpoint, interchangeable and equivalent. The logic signal A is connected to either of the conductive layers 216 or 214 and to either of the conductive layers 208 or 209. In a like manner, logic signal B is connected to the conductive layers not used by logic signal A. The first or bottom transistor is an N-channel transistor and the second and third transistors are P-channel transistors.

In order to function as the NAND gate of FIG. 38, a heavily doped drain region 222 is connected or routed to a ground potential or a reference voltage terminal. The diffusion 220 is connected or routed to a power supply potential or terminal. The second current electrode of the first transistor, the first current electrode of the second transistor, or the conductive layer 212 provides an output signal of the NAND gate. The conductive gate layers 214 and 209 are connected to a first input signal A or act as first input conductors, and conductive gates 216 and 208 are connected to a second input signal B or act as second input conductors. The output conductive layer 212 provides the output logic signal (A NAND B). It should be apparent that the logic signals A and B can be carried by gate conductive layers in different configurations to the gate conductive layers as noted previously. The first transistor is an P-channel transistor and the second and third transistors are N-channel transistors.

Figure 40:
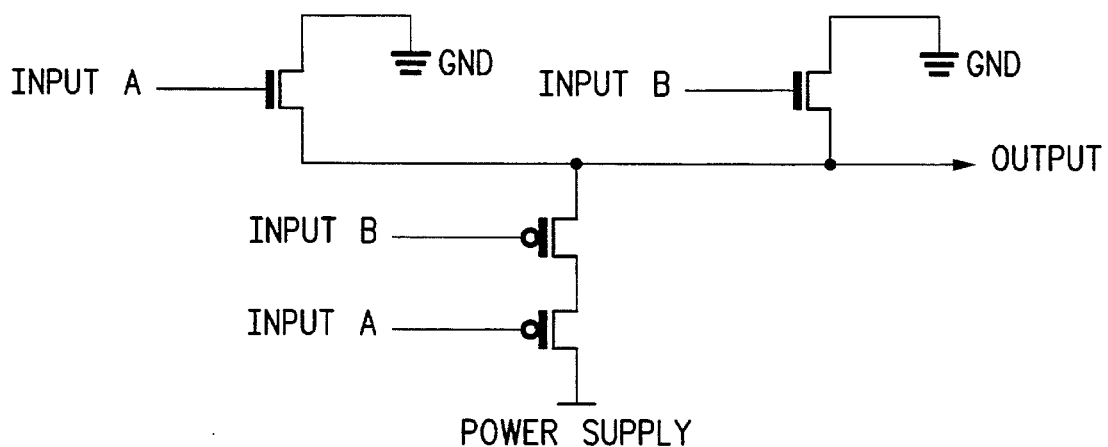
FIG. 40 illustrates, in schematic form, a conventional CMOS NOR gate.

In FIG. 40 a known CMOS NOR circuit is schematically illustrated. The lower two transistors are P-channel devices and the upper two transistors are N-channel devices.

Figure 41:
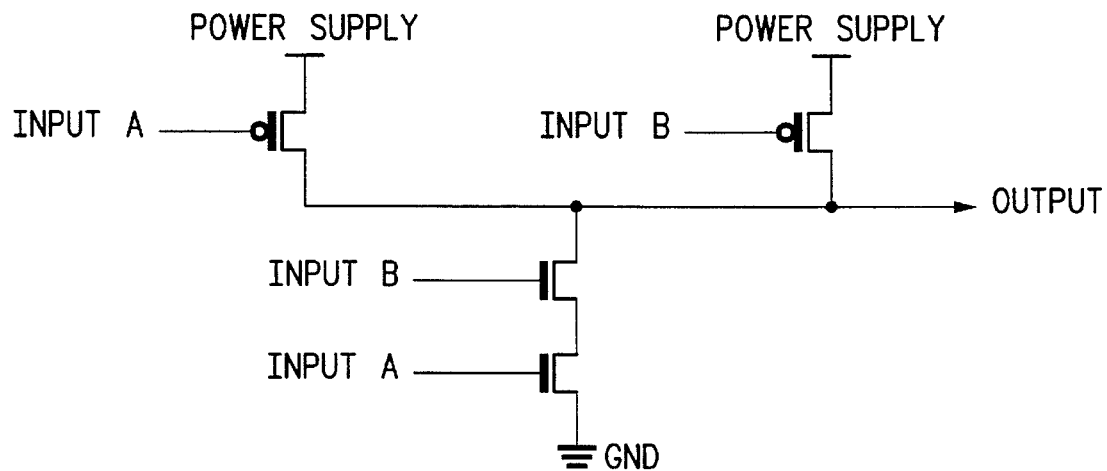
FIG. 41 illustrates, in schematic form, a conventional CMOS NAND gate.

In FIG. 41 a known CMOS NAND circuit is schematically illustrated. The lower two transistors are N-channel devices and the upper two transistors are P-channel devices.

Figure 42:
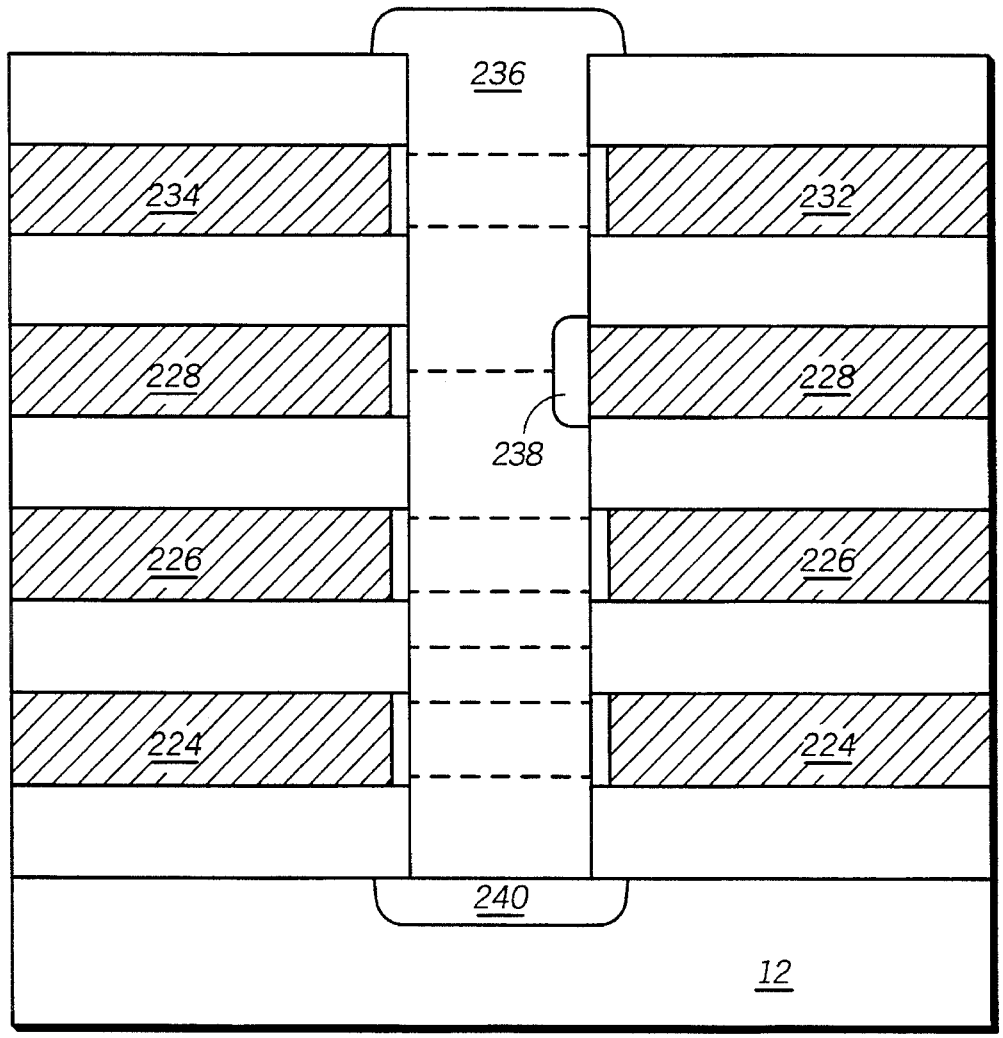
FIG. 42 illustrates, in cross-sectional form, a structure suitable for formation of a NOR gate or a NAND gate in accordance with the present invention.

In FIG. 42, a structure suitable for forming either the NAND gate in accordance with FIG. 41 Or the NOR gate in accordance with FIG. 40 is illustrated. FIG. 42 has substrate 12 and a diffusion 240. A bottom or first transistor is single-gated by a gate conductive layer 224, and has the previously described LDD regions, electrodes, and a channel region. A middle or second transistor is single-gated and has one gate conductive layer 226, an output conductive layer 228, a salicide region 238, and the previously described LDD regions, electrodes, and a channel region. A top or third transistor is double-gated and has two gate conductive layers 232 and 234, and all of the appropriate LDD regions, electrodes, and a channel region.

In order to function as the NOR gate of FIG. 40, a heavily doped drain region 236 is connected or routed to a ground potential or a reference voltage terminal. The diffusion 240 is connected or routed to a power supply potential or terminal. The second current electrode of the second transistor, the first current electrode of the third transistor, or the conductive layer 228 provides an output signal of the NOR gate. The conductive gate layers 224 and 232 are connected to a first input signal A or act as first input conductors, and conductive gates 226 and 234 are connected to a second input signal B or act as second input conductors. The output conductive layer 228 provides the output logic signal (A NOR B). It should be apparent that the logic signals A and B can be connected in different configurations as described above. The first and second transistors are P-channel transistors and the third or top transistor is an N-channel transistor.

In order to function as the NAND gate of FIG. 41, a heavily doped drain region 236 is connected or routed to a power supply potential or terminal. The diffusion 240 is connected or routed to a ground potential or a reference voltage terminal. The second current electrode of the second transistor, the first current electrode of the third transistor, or the conductive layer 228 provides an output signal of the NAND gate. The conductive gate layers 224 and 232 are connected to a first input signal A or act as first input conductors, and conductive gates 226 and 234 are connected to a second input signal B or act as second input conductors. The output conductive layer 228 provides the logic signal (A NAND B). It should be apparent that the logic signals A and B can be connected in different orders to the gate conductive layers while maintaining the same functionality as described above. The first and second transistors are N-channel transistors and the third or top transistor is a P-channel transistor.

With the information disclosed therein, any stacked logic structure or device can be formed. In order to form any logic device, a plurality of N rank ordered stacked transistors is formed where N is an integer. Rank ordered implies that a first transistor in the plurality of N rank ordered stacked transistors underlies the second transistor in the plurality of N rank ordered stacked transistors and so on. In general, each transistor except for the first transistor overlies a transistor of immediately lower rank. Each transistor in the plurality of N rank ordered stacked transistors has a first and second current electrode and a control electrode. For each transistor, either the first current electrode overlies the second current electrode or the second current electrode overlies the first current electrode in a vertical manner. The control electrodes of the transistors and the first and second current electrodes are routed or coupled by conductors to form a logic gate or logic device.

Process integration of the devices discussed above is an important issue. The structure of the logic gates presented in FIGS. 37–38 is similar and the structure of the logic gates presented in FIGS. 40–41 is similar. If the logic gates of FIGS. 37–38 or the logic gates of FIGS. 40–41 are formed concurrently in a process flow, these gates will require only four conductive layers to form all gate electrodes and the output conductor. One disadvantage is that all top, middle, and bottom transistors between FIG. 37 and FIG. 38 have different conductivity types. In a like manner, all transistors between FIG. 40 and FIG. 41 that are at the same top, middle, or bottom level have different conductivity types. Transistors of varying conductivity types cannot be formed by the same epitaxial or doped material and therefore must be formed by separate epitaxial, implant, or deposition processes. The doping differences for this combination of NAND and NOR structures are a not a problem for low temperature selective epitaxial growth.

If the logic gate of FIG. 37 is formed with the logic gate of FIG. 41 in an integrated circuit, transistors within various logic gates can easily be formed concurrently due to the fact that several of the conductivity types of the electrodes at a same vertical level are identical. In a similar manner, if the logic gate of FIG. 38 is formed with the logic gate of FIG. 40 many transistors can be formed concurrently due to the fact that several of the conductivity types of the electrodes at a same vertical level are identical. For example, both the bottom (first) and top (third) transistors of FIG. 42 are of the same conductivity type, either P-channel or N-channel. This allows the first and third transistors to be formed in the same doping or epitaxial step thereby reducing device heat exposure and reducing processing steps. In addition, by forming the devices in the manner described above, the ground connections are all at a same first device level and power supply connections are all at a same second device level. For example, all ground potential regions are diffusions and all power supply potential regions are connected via a first level metal. One disadvantage is that five conductive lines or five layers of polysilicon are needed to form this combination of NAND and NOR gates. The five layers are due to the fact that the output conductors of the NOR gates and NAND gates do not lie at the same vertical surface.

One solution is to use only NAND or NOR gates to form all logic gates such as inverters, NORs, NANDs, ANDs, ORs, XORs, and other logic functions on an integrated circuit. It is known in the art that either NAND or NOR gates can be used to form other logic gates as taught by Demorgan's law and other laws of logic.

The inventive methods and devices presented therein for logic gate formation provide vertical transistor logic and vertical circuits that have reduced surface area, improved short channel behavior, and reduced channel length variation. Leakage currents are reduced due to the fact that current electrodes and channel regions are isolated from the substrate. A length of the transistor 10 is controlled by a conductive layer 18 deposition thickness L as illustrated in FIG. 1. Therefore, the inventive transistor has gate and channel lengths that are independent of lithography, smaller than lithography allows, and controlled within a smaller variation. In addition, deposition thickness L and not increased substrate surface area can be used to adjust P-channel device aspect ratios and device characteristics to match N-channel device characteristics.

The device width of the inventive transistor is larger than conventional planar transistors of the same surface area due to the fact that the channel width of a cylindrical transistor is the cylinder's circumference. It should be noted the cylinder is not required to be spherical, and may be triangular, rectangular, oval, a square, or other geometries. Due to the smaller channel length and the greater channel width, a current carrying capability of the transistor logic increases without increasing logic circuit surface area. In almost all cases, substrate surface area will decrease for logic applications.

The inventive transistor and resulting logic is formed within a contact which is lithographically the smallest feature size in an integrated circuit. In addition, the formation of logic may require only one photolithography step if the logic is formed entirely self-aligned as in FIGS. 15–16. One mask is all that is needed for transistor source electrode, drain electrode, and channel region formation even if the transistors are formed sequentially one at a time. Many features of the transistor taught therein, such as diffusions and gates, can be self-aligned. Asymmetric source and drain electrodes result and LDD and half LDD transistors are easily formed. Bulk inversion of the channel region can be achieved for sub-micron channel region dimensions. Low logic off current, known cross-talk phenomenon, and current leakage to the substrate is minimized due to the fact that many diffusions are placed in series and isolated from the substrate.

Due to the fact that the inventive transistors are placed physically closer to each other in a logic gate, have greater aspect ratios, and avoid many polysilicon, silicon, and metal junctions, logic device speed of operation has the potential to increase.

In some cases, the inventive transistor may be formed in an opening that is too large to fully deplete. Fully depleted transistors and bulk inverted transistor are advantageous and possible for the transistor taught therein if small lithographic geometries are achieved. Full channel region depletion or bulk channel inversion is also desirable for large geometry transistors in order to achieve improved performance. If a sidewall contact is made to the inventive transistor channel region and the sidewall contact is connected to the substrate or a power supply, depending on device conductivity type, improved depletion can be achieved. The sidewall contact is possible for logic gates that have transistor channel regions with non-gated sidewall portions or partially surrounded channel regions. Due to the partially surrounding gate structure presented therein, a channel contact may be made and depletion will be improved.

While the present invention has been illustrated and described with reference to specific embodiments, further modifications and improvements will occur to those skilled in the art. For example, other logic gates and circuit devices can be made such as XOR gates, transfer gates, tri-state buffers, buffers, OR gates, AND gates, and other stacked digital logic devices or circuits with the inventive process and transistor. Various techniques for sidewall dielectric formation exist and various spacer techniques can be used in conjunction with the present invention. Various methods of silicidation exist. Many of the features of the inventive device can be optionally self-aligned or not self-aligned. Many device structures are possible, such as no LDD, half LDD, full LDD, double LDD, and in-situ graded LDD electrode structures. Nitrided gate oxides are used to reduce RIE (reactive ion etch) damage to sidewall gate dielectrics. Various process integration schemes are possible due to the wide range of logic structures and various differences in device doping. Two-input NAND and NOR gates are specifically described therein. It should be apparent that the methods and devices taught therein can be used to form logic gates having more than two inputs. It is to be understood, therefore, that this invention is not limited to the particular forms illustrated and that it is intended in the appended claims to cover all modifications that do not depart from the spirit and scope of this invention.

We claim:

1. A transistor structure comprising:
   plurality of M stacked transistors, where M is an integer, each of the M stacked transistors having:
   a base layer having a surface;
   a first dielectric layer overlying the base layer;
   a control electrode conductive layer overlying the first dielectric layer;
   a second dielectric layer overlying the control electrode conductive layer;
   a device opening formed through each of the first dielectric layer, the control electrode conductive layer, and the second dielectric layer to expose the base layer, the device opening separating the control electrode conductive layer into N control electrode(s) where N is an integer, each of the N control electrode(s), having a sidewall;
   a sidewall dielectric formed laterally adjacent each sidewall of the N control electrode(s),
   a first current electrode formed within the device opening and overlying the base layer;
   a channel region formed within the device opening, laterally adjacent each sidewall dielectric of the N control electrode(s), and overlying the first current electrode;
   a second current electrode formed overlying the channel region; and
   wherein each of the M stacked transistors have N control electrode(s) where N is a finite positive integer, each of the M stacked transistors, except an Mth top transistor which overlies all other M stacked transistors, having a second current electrode thereof electrically coupled to a first current electrode of an immediately overlying transistor, the transistor structure having an output conductor for providing an output signal, the output conductor being coupled to one second current electrode of one of the M stacked transistors wherein the one of the M stacked transistors is any of the M stacked transistors except the Mth top transistor which overlies all other M stacked transistors.

2. The transistor structure of claim 1 wherein a first transistor in the M stacked transistors is an N-channel transistor and a second transistor in the M stacked transistors is a P-channel transistor.

3. The transistor structure of claim 1 further comprising:
   a first transistor and a second transistor which comprise the M stacked transistors where M is two, the first transistor underlying the second transistor and having a first control electrode and a second control electrode where N is two for the first transistor, and the second transistor having a control electrode wherein N is one for the second transistor;
   a first conductor coupling the first current electrode of the first transistor to a reference voltage terminal;
   a second conductor coupling the second current electrode of the second transistor to a power supply terminal;
   the output conductor coupled either to the second current electrode of the first transistor or the first current electrode of the second transistor;
   a first input conductor coupled to the first control electrode of the first transistor; and
   a second input conductor coupled to the second control electrode of the first transistor for the formation of a NOR logic gate.

4. The transistor structure of claim 1 further comprising:
   a first transistor, a second transistor, and a third transistor which comprise the M stacked transistors where M is three, the first transistor underlying the second transistor, the second transistor underlying the third transistor, and each of the first, second, and third transistors having at least one control electrode where N is greater than one for the third transistor;
   a first conductor coupling the first current electrode of the first transistor to a reference voltage terminal;
   a second conductor coupling the second current electrode of the third transistor to a power supply terminal;
   the output conductor electrically coupled to both the second current electrode of the second transistor and the first current electrode of the third transistor;
   a first input conductor coupled to a control electrode of the first transistor; and
   a second input conductor coupled to a control electrode of the second transistor for the formation of a NAND logic gate.

5. The transistor structure of claim 1 further comprising:

a first transistor and a second transistor which comprise the M stacked transistors where M is two, the first transistor underlying the second transistor, and each of the first and second transistors having a single control electrode where N is one for the first and second transistors, the second current electrode of the first transistor being coupled to the first current electrode of the second transistor to define an output node region;

a first conductor coupling the first current electrode of the first transistor to a reference voltage terminal;

a second conductor coupling the second current electrode of the second transistor to a power supply terminal;

the output conductor coupled to the output node region for providing an output signal; and an input conductor coupled to the control electrode of the first transistor to complete formation of an inverter logic gate.

6. The transistor structure of claim 1 further comprising:

a first transistor, a second transistor, and a third transistor which comprise the M stacked transistors where M is three, the first transistor underlying the second transistor, the second transistor underlying the third transistor, the first transistor having a first control electrode and a second control electrode where N is two for the first transistor, and the second and third transistors each having a control electrode where N is one for the second and third transistors;

a first conductor coupling the first current electrode of the first transistor to a reference voltage terminal;

a second conductor coupling the second current electrode of the third transistor to a power supply terminal;

the output conductor coupled to the second current electrode of the first transistor and the first current electrode of the second transistor;

a first input conductor coupled to the first control electrode of the first transistor;

a second input conductor coupled to the second control electrode of the first transistor; and routing wherein either the first input conductor is coupled to the control electrode of the third transistor and the second input conductor is coupled to the control electrode of the second transistor or the second input conductor is coupled to the control electrode of the third transistor and the first input conductor is coupled to the control electrode of the second transistor to complete formation of a NOR logic gate.

7. The transistor structure of claim 1 further comprising:

a first transistor, a second transistor, and a third transistor which comprise the M stacked transistors where M is three, the first transistor underlying the second transistor, the second transistor underlying the third transistor, each of the first and second transistors having a control electrode where N is one for the first and second transistors, and the third transistor having a first control electrode and a second control electrode where N is two for the third transistor;

a first conductor coupling the first current electrode of the first transistor to a reference voltage terminal;

a second conductor coupling the second current electrode of the third transistor to a power supply terminal;

the output conductor coupled to the second current electrode of the second transistor and the first current electrode of the third transistor;

a first input conductor coupled to the first control electrode of the third transistor;

a second input conductor coupling the second control electrode of the third transistor; and routing wherein either the first input conductor is coupled to the control electrode of the first transistor and the second input conductor is coupled to the control electrode of the second transistor or the second input conductor is coupled to the control electrode of the first transistor and the first input conductor is coupled to the control electrode of the second transistor to complete formation of a NAND logic gate.

8. The transistor structure of claim 1 further comprising:

a first transistor and a second transistor which comprise the M stacked transistors where M is two, the first transistor underlying the second transistor, and each of the first and second transistors having a control electrode where N is one for the first and second transistors, the second current electrode of the first transistor being coupled to the first current electrode of the second transistor to define an output node region;

a first conductor coupling the first current electrode of the first transistor to a reference voltage terminal;

a second conductor coupling a second current electrode of the second transistor to a power supply terminal;

the output conductor coupled the output node region to provide an output signal; and an input conductor coupling the control electrodes of the first and second transistors to complete formation of an inverter logic gate.

9. The transistor structure of claim 1 further comprising:

a first transistor and a second transistor which comprise the M stacked transistors where M is two, the first transistor underlying the second transistor, the second transistor having a first control electrode and a second control electrode where N is two for the second transistor, and the first transistor having a control electrode where N is one for the first transistor;

a first conductor coupling the first current electrode of the first transistor to a power supply terminal;

a second conductor coupling the second current electrode of the second transistor to a reference voltage terminal;

the output conductor coupled to either the second current electrode of the first transistor or the first current electrode of the second transistor;

a first input conductor coupled to the first control electrode of the second transistor; and a second input conductor coupled to the second control electrode of the second transistor for the formation of a NOR logic gate.

10. The transistor structure of claim 1 further comprising:

a first transistor, a second transistor, and a third transistor which comprise the M stacked transistors where M is three, the first transistor underlying the second transistor, the second transistor underlying the third transistor, and each of the first, second, and third transistors having a control electrode where N is at least one for the first, second, and third transistors, the first current electrode of an L stacked transistor, where L is an integer within the range of 2 through M, being coupled to the second current electrode of an (L-1) stacked transistor to form an output node;

a first conductor coupling the first current electrode of the first transistor to a power supply terminal;

a second conductor coupling the second current electrode of the third transistor to a reference voltage terminal;

the output conductor coupled to the output node to provide an output signal;

a first input conductor coupled to the control electrode of the second transistor; and a second input conductor coupled to one of the at least one control electrode of the third transistor for the formation of a NAND logic gate.

11. The transistor structure of claim 1 further comprising:

a first transistor and a second transistor which comprise the M stacked transistors where M is two, the first transistor underlying the second transistor, and each of the first and second transistors having a control electrode where N is one for the first and second transistors, the first current electrode of the second transistor being coupled to the second current electrode of the first transistor to define an output node;

a first conductor coupling the first current electrode of the first transistor to a power supply terminal;

a second conductor coupling the second current electrode of the second transistor to a reference voltage terminal;

the output conductor coupled to the output node for providing an output signal; and an input conductor coupling the control electrodes of the first and second transistors to complete formation of an inverter logic gate.

12. The transistor structure of claim 1 further comprising:

a first transistor, a second transistor, and a third transistor which comprise the M stacked transistors where M is three, the first transistor underlying the second transistor, the second transistor underlying the third transistor, the third transistor having a first control electrode and a second control electrode where N is two for the third transistor, and the first and second transistors each having a control electrode;

a first conductor coupling the first current electrode of the first transistor to a power supply terminal;

a second conductor coupling the second current electrode of the third transistor to a reference voltage terminal;

the output conductor coupled to the second current electrode of the second transistor and the first current electrode of the third transistor;

a first input conductor coupled to the first control electrode of the third transistor;

a second input conductor coupled to the second control electrode of the third transistor; and routing wherein either the first input conductor is coupled to the control electrode of the first transistor and the second input conductor is coupled to the control electrode of the second transistor or the second input conductor is coupled to the control electrode of the first transistor and the first input conductor is coupled to the control electrode of the second transistor to complete formation of a NOR logic gate.

13. The transistor structure of claim 1 further comprising:

a first transistor, a second transistor, and a third transistor which comprise the M stacked transistors wherein M is three, the first transistor underlying the second transistor, the second transistor underlying the third transistor, each of the second and third transistors having a control electrode where N is one for the second and third transistors, and the first transistor having a first control and a second control electrode where N is two for the first transistor;

a first conductor coupling the first current electrode of the first transistor to a power supply terminal;

a second conductor coupling the second current electrode of the third transistor to a reference voltage terminal;

the output conductor coupled to the second current electrode of the first transistor and the first current electrode of the second transistor;

a first input conductor coupled to the first control electrode of the first transistor;

a second input conductor coupled to the second control electrode of the first transistor; and routing wherein either the first input conductor is coupled to the control electrode of the third transistor and the second input conductor is coupled to the control electrode of the second transistor or the second input conductor is coupled to the control electrode of the third transistor and the first input conductor is coupled to the control electrode of the second transistor to complete formation of a NAND logic gate.

14. The transistor structure of claim 1 further comprising:

a first transistor and a second transistor which comprise the M stacked transistors where M is two, the first transistor underlying the second transistor wherein one of the first transistor or the second transistor is an N-channel transistor and a remaining transistor of the first and second transistors is a P-channel transistor, each of the first and second transistors having a control electrode where N is one for the first and second transistors, the first current electrode of the second transistor being coupled to the second current electrode of the first transistor to form an output node;

a first conductor coupling the first current electrode of the first transistor to a first power supply terminal;

a second conductor coupling the second current electrode of the second transistor to a second power supply terminal;

the output conductor coupled to the output node for providing an output signal; and an input conductor coupling the control electrodes of the first and second transistors to complete formation of a CMOS inverter logic gate.

15. The transistor structure of claim 1 further comprising:

a first transistor, a second transistor, and a third transistor which comprise the M stacked transistors where M is three, the first transistor underlying the second transistor, the second transistor underlying the third transistor, and each of the first, second, and third transistors having at least one control electrode where N is greater than one for the first transistor;

a first conductor coupling the first current electrode of the first transistor to a power supply terminal;

a second conductor coupling the second current electrode of the third transistor to a reference voltage terminal;

the output conductor electrically coupled to both the second current electrode of the first transistor and the first current electrode of the second transistor;

a first input conductor coupled to a control electrode of the first transistor; and a second input conductor coupled to a control electrode of the second transistor for the formation of a NAND logic gate.

16. A logic device comprising:

a substrate having a top-most surface;

a plurality of N rank ordered stacked transistors, where N is an integer, each transistor except a first transistor thereof overlying a transistor of immediately lower rank, each transistor having a first current electrode, a second current electrode, and at least one control electrode wherein for each of the stacked transistors either the first current electrode overlies the second current electrode thereof or the second current electrode overlies the first current electrode thereof where the first and second current electrodes are separated by a channel region, the plurality of N rank ordered stacked transistors being at least partially surrounded by both dielectric insulation material and gate dielectric material, a channel region of at least one of the transistors in the plurality of rank ordered stacked transistors overlying the top-most surface of the substrate;

gate conductors, which are surrounded by the dielectric insulation material and overlie the top-most surface of the substrate, are coupled to each control electrode within the plurality of stacked transistors to provide control voltages to the transistors to alter a current flow through the channel regions; and an output conductor coupled to a predetermined current electrode within the N rank ordered stacked transistors, the output conductor being surrounded by the dielectric insulation material, wherein at least one of the transistors has at least two independent control electrodes.

17. The logic device of claim 16 wherein the output conductor selectively provides both a logic level one and a logic level zero out from the transistors in mutually exclusive time intervals.

18. The logic device of claim 16 wherein a top-most current electrode of the N rank ordered stacked transistors is coupled to the first power supply conductor and a lowest-most current electrode of the N rank ordered stacked transistors is coupled to the second power supply conductor wherein the second power supply conductor provides a voltage potential having a different value than the first power supply conductor.

19. A logic device comprising:

a substrate having a top surface;

a first vertical transistor having a first current electrode coupled to a first power supply conductive region, a second current electrode overlying the first current electrode, a channel region separating the first current electrode and the second current electrode, a gate dielectric layer having a first side and a second side wherein the first side is abutting the channel region and the second side is abutting at least one gate electrode wherein the gate dielectric layer separates the channel region and the at least one gate electrode; and a second vertical transistor overlying the first vertical transistor, the second vertical transistor having a first current electrode coupled to the second current electrode of the first vertical transistor, a second current electrode overlying the first current electrode of the second transistor, the second current electrode being coupled to a second power supply conductive region, a channel region separating the first current electrode and the second current electrode, a gate dielectric layer having a first side and a second side wherein the first side is abutting the channel region and the second side is abutting at least one gate electrode wherein the gate dielectric layer separates the channel region and the at least one gate electrode, the second current electrode of the second vertical transistor overlying the top surface of the substrate;

an output conductive layer coupled to a location between the first and second transistors, the output conductive layer providing an output signal from the first and second transistors and being isolated by dielectric material and overlying the top surface of the substrate, the logic device having one logical output provided via the output conductive layer and at least two logical inputs.

20. The logic device of claim 19 wherein a metallic silicide region is between the first current electrode of the second transistor and the second current electrode of the first transistor to reduce diode voltage drops across the first current electrode of the second transistor and the second current electrode of the first transistor.

21. The logic device of claim 19 wherein the first and second transistors are coupled to form a logic device selected from a group consisting of: an AND gate, and a NAND gate.

22. The logic device of claim 19 wherein the first and second transistors are coupled to form a logic device selected from a group consisting of: an OR gate, and a NOR gate.

23. The logic device of claim 19 wherein the first vertical transistor is an N channel transistor and the second vertical transistor is a P channel transistor.

24. The logic device of claim 19 wherein the first vertical transistor is a P channel transistor and the second vertical transistor is an N channel transistor.

25. The logic device of claim wherein 19 the first and second current electrodes of the first vertical transistor is of a conductivity type and the first and second current electrodes of the second vertical transistor is of the same conductivity type as the first and second current electrodes of the first vertical transistor.

26. The logic device of claim 19 wherein the second current electrode of the first vertical transistor is connected to the first current electrode of the second vertical transistor by a metallic region so that a voltage drop between the first current electrode of the second vertical transistor and the second current electrode of the first vertical transistor is substantially equal to zero.

27. The logic device of claim 19 wherein the first power supply conductive region is coupled to a ground potential and the second power supply conductive region is coupled to a power supply potential other than the ground potential.

28. The logic device of claim 19 wherein the second power supply conductive region is coupled to a ground potential and the first power supply conductive region is coupled to a power supply potential other than the ground potential.

29. The logic device of claim 19 wherein the second current electrode of the first vertical transistor is connected to the first current electrode of the second vertical transistor to form an output node wherein the output node is coupled to a conductive interconnect layer.

30. The logic device of claim 19 wherein the first current electrode of the second vertical transistor is coupled to the second current electrode of the first vertical transistor through a channel region of an interconnect transistor.

31. The logic device of claim 19 wherein a third transistor is coupled to the second transistor.

32. The logic device of claim 19 wherein the first and second transistors are coupled to form a logic device selected from a group consisting of: a CMOS NAND gate, a PMOS NAND gate, and an NMOS NAND gate.

33. The logic device of claim 19 wherein the first and second transistors are coupled to form a logic device selected from a group consisting of: a CMOS NOR gate, a PMOS NOR gate, and an NMOS NOR gate.

34. A logic device comprising:

a first vertical transistor having a first current electrode, a second current electrode overlying the first current electrode, and a control electrode which controls a current flow between the first current electrode and the second current electrode; and a second vertical transistor overlying the first vertical transistor and having a first current electrode coupled to the second current electrode of the first vertical transistor, a second current electrode overlying the first current electrode of the second vertical transistor, and a control electrode which controls a current flow between the first current electrode and the second current electrode;

wherein the first and second vertical transistors are electrically interconnected to form, at least in part, the logic device wherein the logic device performs a predetermined logic function selected from a group consisting of: AND, OR, NAND, NOR, and XOR.

35. A two-input logic device comprising:

a first vertical transistor having a first current electrode, a second current electrode overlying the first current electrode, and a control electrode which controls a current flow between the first current electrode and the second current electrode;

a second vertical transistor having a first current electrode coupled to the second current electrode of the first vertical transistor to form a first node, a second current electrode overlying the first current electrode of the second vertical transistor, and a control electrode which controls a current flow between the first current electrode and the second current electrode of the second vertical transistor;

a third vertical transistor having a first current electrode coupled to the second current electrode of the second vertical transistor to form a second node, a second current electrode overlying the first current electrode of the third vertical transistor, and a control electrode which controls a current flow between the first current electrode and the second current electrode of the third vertical transistor;

an output conductor coupled to one of either the first node or the second node to provide an output logic signal;

a first power supply conductor coupled to the first current electrode of the first transistor; and a second power supply conductor coupled to the second current electrode of the third transistor.

36. The device of claim 35 wherein each control electrode of the first, second, and third vertical transistors are coupled to a conductive interconnect carrying one of two logic signals.

37. An integrated circuit comprising:

a first vertical transistor having a first current electrode, a second current electrode overlying the first current electrode, and a control electrode which controls a current flow between the first current electrode and the second current electrode; and a second vertical transistor having a first current electrode coupled to the second current electrode of the first vertical transistor, a second current electrode overlying the first current electrode of the second vertical transistor, and a control electrode which controls a current flow between the first current electrode and the second current electrode of the second vertical transistor;

wherein the first and second vertical transistors are electrically interconnected to form a logic device wherein the logic device performs a predetermined logic function;

a third vertical transistor having a first current electrode, a second current electrode overlying the first current electrode of the third vertical transistor, and a control electrode which controls a current flow between the first current electrode and the second current electrode of the third vertical transistor, the third vertical transistor being laterally separated from the first vertical transistor; and a fourth vertical transistor having a first current electrode coupled to the second current electrode of the third vertical transistor, a second current electrode overlying the first current electrode of the fourth vertical transistor, and a control electrode which controls a current flow between the first current electrode and the second current electrode of the fourth vertical transistor;

wherein a conductive interconnection layer is coupled between one of the first current electrode, the second current electrode, and the control electrode of the first transistor and one of the first current electrode, the second current electrode, and the control electrode of the third transistor.

38. A logic device comprising:

a first vertical transistor having a first current electrode, a second current electrode overlying the first current electrode, and a control electrode which controls a current flow between the first current electrode and the second current electrode;

a second vertical transistor overlying the first vertical transistor and having a first current electrode coupled to the second current electrode of the first vertical transistor, a second current electrode overlying the first current electrode of the second vertical transistor, and a control electrode which controls a current flow between the first current electrode and the second current electrode; and an output conductor coupled to the first vertical transistor wherein a portion of the output conductor overlies a portion of the control electrode of the first transistor;

wherein the first and second vertical transistors are electrically interconnected to form the logic device wherein the logic device performs a predetermined logic function.

39. A logic device comprising:

a substrate having a top surface;

a first vertical transistor having a first current electrode coupled to a first power supply conductive region, a second current electrode overlying the first current electrode, a channel region separating the first current electrode and the second current electrode, a gate dielectric layer having a first side and a second side wherein the first side is abutting the channel region and the second side is abutting at least one gate electrode wherein the gate dielectric layer separates the channel region and the at least one gate electrode; and a second vertical transistor overlying the first vertical transistor, the second vertical transistor having a first current electrode coupled to the second current electrode of the first vertical transistor, a second current electrode overlying the first current electrode of the second transistor, the second current electrode being coupled to a second power supply conductive region, a channel region separating the first current electrode and the second current electrode, a gate dielectric layer having a first side and a second side wherein the first side is abutting the channel region and the second side is abutting at least one gate electrode wherein the gate dielectric layer separates the channel region and the at least one gate electrode, the second current electrode of the second vertical transistor overlying the top surface of the substrate, the first and second current electrodes of the first vertical transistor is of a conductivity type and the the first and second current electrodes of second vertical transistor is of the same conductivity type as the first and second current electrodes of the first vertical transistor;

an output conductive layer coupled to a location between the first and second transistors, the output conductive layer providing an output signal from the first and second transistors and being isolated by dielectric material and overlying the top surface of the substrate.

40. A logic device comprising:

a substrate having a top surface;

a first vertical transistor having a first current electrode coupled to a first power supply conductive region, a second current electrode overlying the first current electrode, a channel region separating the first current electrode and the second current electrode, a gate dielectric layer having a first side and a second side wherein the first side is abutting the channel region and the second side is abutting at least one gate electrode wherein the gate dielectric layer separates the channel region and the at least one gate electrode; and a second vertical transistor overlying the first vertical transistor, the second vertical transistor having a first current electrode coupled to the second current electrode of the first vertical transistor through a channel region of a third transistor, a second current electrode overlying the first current electrode of the second transistor, the second current electrode being coupled to a second power supply conductive region, a channel region separating the first current electrode and the second current electrode, a gate dielectric layer having a first side and a second side wherein the first side is abutting the channel region and the second side is abutting at least one gate electrode wherein the gate dielectric layer separates the channel region and the at least one gate electrode, the second current electrode of the second vertical transistor overlying the top surface of the substrate;

an output conductive layer coupled to a location between the first and second transistors, the output conductive layer providing an output signal from the first and second transistors and being isolated by dielectric material and overlying the top surface of the substrate.

* * * * *